(12) United States Patent
Xu et al.

(10) Patent No.: US 9,543,248 B2
(45) Date of Patent: Jan. 10, 2017

(54) INTEGRATED CIRCUIT DEVICES AND METHODS

(71) Applicant: QUALCOMM Incorporated, San Diego, CA (US)

(72) Inventors: Jeffrey Junhao Xu, San Diego, CA (US); Junjing Bao, San Diego, CA (US); John Jianhong Zhu, San Diego, CA (US); Stanley Seungchul Song, San Diego, CA (US); Niladri Narayan Mojumder, San Diego, CA (US); Choh Fei Yeap, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/819,159

(22) Filed: Aug. 5, 2015

(65) Prior Publication Data

US 2016/0211216 A1    Jul. 21, 2016

Related U.S. Application Data

(60) Provisional application No. 62/106,106, filed on Jan. 21, 2015.

(51) Int. Cl.
*H01L 23/522* (2006.01)
*H01L 23/532* (2006.01)
(Continued)

(52) U.S. Cl.
CPC ..... *H01L 23/53219* (2013.01); *B29C 67/0088* (2013.01); *G05B 19/418* (2013.01);
(Continued)

(58) Field of Classification Search
CPC ............ H01L 23/522; H01L 23/53233; H01L 23/53238; H01L 21/76834
See application file for complete search history.

(56) References Cited

U.S. PATENT DOCUMENTS 5,635,423 A    6/1997  Huang et al.
6,249,055 B1   6/2001  Dubin
(Continued)

FOREIGN PATENT DOCUMENTS

JP    H11186390 A    7/1999
JP    2008010534 A   1/2008
JP    2010141024 A   6/2010

OTHER PUBLICATIONS

Ames, I., et al., "Reduction of Electromigration in Aluminum Films by Copper Doping", Jul. 1970, vol. 14, Issue 4, IBM Journal of Research and Development, Yorktown Heights, NY, pp. 461-463.
(Continued)

*Primary Examiner* — Phuc Dang
(74) *Attorney, Agent, or Firm* — Toler Law Group

(57) ABSTRACT

An integrated circuit device includes a first metal layer including aluminum. The integrated circuit device includes a second metal layer including an interconnect structure. The interconnect structure includes a layer of first material including aluminum. The integrated circuit device includes an inter-diffusion layer that includes aluminum. The inter-diffusion layer is proximate to the first metal layer and proximate to the layer of first material including aluminum. The integrated circuit device includes a self-forming barrier layer that includes aluminum. The self-forming barrier layer is proximate to a dielectric layer and proximate to the layer of first material including aluminum.

20 Claims, 17 Drawing Sheets

(51) Int. Cl.
*H01L 23/528* (2006.01)
*H01L 21/768* (2006.01)
*B29C 67/00* (2006.01)
*G05B 19/418* (2006.01)
*B33Y 50/02* (2015.01)

(52) U.S. Cl.
CPC .... *H01L 21/7682* (2013.01); *H01L 21/76846* (2013.01); *H01L 21/76871* (2013.01); *H01L 23/528* (2013.01); *H01L 23/5226* (2013.01); *H01L 23/53223* (2013.01); *B33Y 50/02* (2014.12); *G05B 2219/45031* (2013.01); *H01L 2924/0002* (2013.01)

(56) References Cited

U.S. PATENT DOCUMENTS

| | | | |
|---|---|---|---|
| 6,380,065 | B1 | 4/2002 | Komai et al. |
| 6,537,905 | B1 | 3/2003 | Chen et al. |
| 7,727,883 | B2 | 6/2010 | Ishizaka et al. |
| 8,124,524 | B2 | 2/2012 | Choi et al. |
| 8,722,531 | B1 | 5/2014 | Lin et al. |
| 2007/0178713 | A1* | 8/2007 | Jeng .................. H01L 21/76814 438/787 |
| 2010/0078818 | A1 | 4/2010 | Ishizaka et al. |
| 2010/0130001 | A1* | 5/2010 | Noguchi ........... H01L 21/76811 438/627 |
| 2011/0204518 | A1 | 8/2011 | Arunachalam |
| 2011/0269308 | A1* | 11/2011 | Kansaku ........... H01L 21/76846 438/653 |
| 2012/0112350 | A1 | 5/2012 | Kriz et al. |
| 2014/0299988 | A1 | 10/2014 | Cabral, Jr. et al. |
| 2015/0171007 | A1* | 6/2015 | Huang ................ H01L 23/5226 257/774 |
| 2015/0249038 | A1* | 9/2015 | Xu .................... H01L 23/53223 257/751 |

OTHER PUBLICATIONS

Ding, P. J., et al., "Effects of the Addition of Small Amounts of Al to Copper: Corrosion, Resistivity, Adhesion, Morphology, and Diffusion," Journal of Applied Physics, Apr. 1994, vol. 75, No. 7, Apr. 1, 1994, American Institute of Physics, Melville, NY, pp. 3627-3631.

Hu, C.-K., et al., "Electromigration and stress-induced voiding in fine Al and Al-alloy thin-film lines," Jul. 1995, vol. 39, No. 4, IBM Journal of Research and Development, Yorktown Heights, NY, pp. 465-497.

International Search Report and Written Opinion for International Application No. PCT/US2016/014140, ISA/EPO, Date of Mailing Apr. 25, 2016, 13 pages.

Thompson, C.V., et al., "Effects of Microstructure on Interconnect and Via Reliability: Multimodal Failure Statistics," Journal of Electronic Materials, 1993, vol. 22, No. 6, Springer Science+Business Media, New York, NY, pp. 581-587.

* cited by examiner

INTEGRATED CIRCUIT DEVICES AND METHODS

I. CROSS-REFERENCE TO RELATED APPLICATIONS

The present application claims priority from commonly owned U.S. Provisional Patent Application No. 62/106,106 filed Jan. 21, 2015 and entitled "INTEGRATED CIRCUIT DEVICES AND METHODS," the contents of which are expressly incorporated herein by reference in their entirety.

II. FIELD

The disclosure is generally related to integrated circuit devices and methods.

III. DESCRIPTION OF RELATED ART

Advances in technology have resulted in smaller and more powerful computing devices. For example, a variety of portable personal computing devices, including wireless telephones, such as mobile and smart phones, tablets and laptop computers, are small, lightweight, and easily carried by users. These devices can communicate voice and data packets over wireless networks. Further, many such devices incorporate additional functionality such as a digital still camera, a digital video camera, a digital recorder, and an audio file player. Also, such devices can process executable instructions, including software applications, such as a web browser application, that can be used to access the Internet. As such, these devices can include significant computing capabilities.

Integrated circuit (IC) devices used in computing devices also continue to change and improve. As electronic device sizes (e.g., transistor sizes) decrease, and the number of devices on an IC increases, interconnecting electronic devices becomes more challenging. For example, as metal line widths and spacing decrease, resistance of the metal lines increases (due to decreases in conductive cross-section (as a result of decreased metal line width), and capacitance of the metal lines increases (due to decreased spacing between metal lines). Increased resistance and capacitance leads to increased resistive capacitive (RC) delay of the metal lines and limits performance of the integrated circuits.

IV. SUMMARY

Using aluminum to form metal lines (e.g., back end of line (BEOL) metal lines) may reduce RC delay. For example, aluminum quickly reacts in the presence of oxygen (e.g., $O_2$) to form (e.g., self-form) aluminum oxide (e.g., $Al_2O_3$), which can act as a barrier layer (e.g., a self-forming barrier layer) between primary fill material of the metal line (e.g., aluminum or an aluminum alloy) and surrounding materials (e.g., a low-k dielectric material). This self-forming barrier layer may reduce the need for barrier/liner layers used for forming barriers for some metal line materials, such as copper (Cu). Thus, the self-forming barrier layer may allow a greater portion of a metal line's width to be formed of conductive materials (e.g., primary fill material), resulting in an increase in conductive cross section for the same line width.

In a particular aspect, an apparatus includes a first metal layer including aluminum. The apparatus may also include a second metal layer including an interconnect structure. The interconnect structure includes a layer of first material including aluminum. The apparatus includes an inter-diffusion layer including aluminum. The inter-diffusion layer is proximate to the first metal layer and proximate to the layer of first material including aluminum. The apparatus includes a self-forming barrier layer that includes aluminum. The self-forming barrier layer is proximate to a dielectric layer and the layer of first material including aluminum.

In a particular aspect, a method of forming an integrated circuit device includes forming a first opening in a dielectric layer. The first opening may expose a portion of a first metal layer that includes aluminum. The method further includes forming an inter-diffusion layer at least in part by selectively forming a conductive layer in the first opening proximate to the portion of the first metal layer and by depositing material of a second metal layer proximate to the conductive layer. The material of the second metal layer includes aluminum.

In a particular aspect, a non-transitory computer-readable medium comprises processor-executable instructions that, when executed by a processor, cause the processor to initiate fabrication of an electronic device. The electronic device is fabricated by forming a first opening in a dielectric layer. The first opening may expose a portion of a first metal layer that includes aluminum. The electronic device is further fabricated by forming an inter-diffusion layer. The inter-diffusion layer is formed at least in part by selectively forming a conductive layer proximate to the portion of the first metal layer and by depositing material of a second metal layer proximate to the conductive layer. The material of the second metal layer includes aluminum.

One particular advantage provided by at least one of the disclosed examples, implementations, or aspects is that self-forming a barrier layer between primary fill material of a metal line and dielectric material proximate to the metal line may allow for formation of a thinner barrier layer than when the barrier layer is formed by depositing a dedicated diffusion barrier/liner layer. The thinner barrier layer enabled by self-forming the barrier layer may allow for a larger cross-sectional area of the metal line to be filled with the primary fill material. Also, an inter-diffusion layer located between metal layers of a conductive device may provide an effective electromigration (EM) cap without requiring deposition of a dedicated barrier/liner, thereby preserving cross-sectional area of the one or more openings for conductive materials. Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

VI. DETAILED DESCRIPTION

Figure 1:
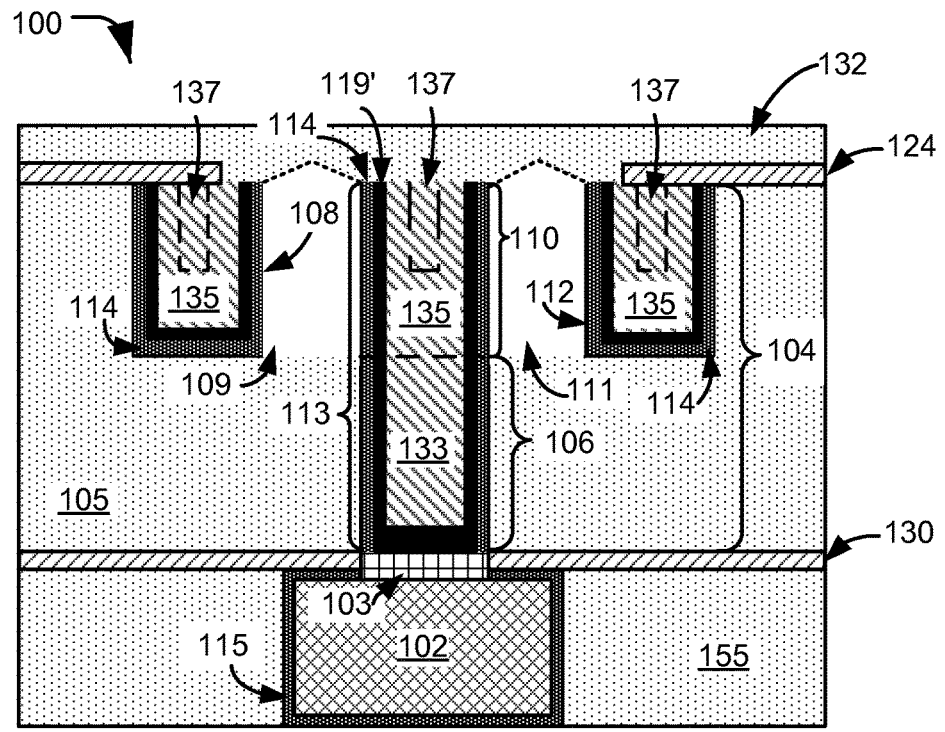
FIG. 1 is a side view of a device including an inter-diffusion layer and a self-forming barrier layer proximate to portions of a seed layer.

An integrated circuit device that includes aluminum lines, an inter-diffusion layer, a self-forming barrier layer, and a seed layer is generally illustrated as 100 in FIG. 1. The integrated circuit device 100 includes a first metal layer 102 including aluminum. The first metal layer 102 may correspond to a contact coupled (e.g., directly coupled or indirectly coupled) to a source/drain [not illustrated] or to a gate [not illustrated] of a transistor structure (e.g., a semiconductor transistor). The first metal layer 102 may correspond to a front end of line (FEOL) interconnect or a back end of line (BEOL) interconnect.

The integrated circuit device 100 includes a second metal layer 104 that includes an interconnect structure formed of or including one or more materials that include aluminum. The interconnect structure may be formed in a dielectric layer 105. The interconnect structure may include an interconnect 113 that includes a via portion 106 and includes a first metal line 110 (e.g., a first BEOL metal line) coupled to the via portion 106. Additionally, the interconnect structure may include a second metal line 108 (e.g., a second BEOL metal line) and/or a third metal line 112 (e.g., a third BEOL metal line).

One or more airgaps may separate portions of adjacent metal lines of the interconnect structure. For example, a first airgap 109 may be located between a portion of the first metal line 110 and a portion of the second metal line 108. Thus, the second metal line 108 may be separated from the first metal line 110 by the first airgap 109. As another example, a second airgap 111 may be located between a portion of the first metal line 110 and a portion of the third metal line 112. Thus, the third metal line 112 may be separated from the first metal line 110 by the second airgap 111. In a particular aspect, a distance between the first metal line 110 and the second metal line 108 may be about 12 to 15 nanometers (nm), and a distance between the first metal line 110 and the third metal line 112 may be about 12 to 15 nm. Thus, the first airgap 109 and/or the second airgap 111 may each have a width of about 12 to 15 nm.

The interconnect structure may be formed using a dual damascene process (e.g., a BEOL dual damascene process). For example, dielectric material of the dielectric layer 105 may be deposited; one or more openings may be formed in the dielectric material of the dielectric layer 105 using lithographic and/or etching techniques; and the interconnect 113, the second metal line 108, and the third metal line 112 may be formed by depositing materials using a dual damascene deposition process (e.g., using a physical vapor deposition (PVD) seed followed by electroplating) as described in more detail with reference to FIGS. 2-16.

The second metal layer 104 includes a primary fill formed of one or more materials including aluminum. In some examples, the primary fill of the second metal layer 104 may be formed using three primary fill deposition stages. For example, the primary fill of the second metal layer 104 may be formed using the three primary fill deposition stages to deposit layer 133 formed of or including aluminum, layer 135 formed of or including aluminum, and layer 137 formed of or including aluminum. The layer 133 may be selectively deposited (e.g., by CVD) in the first primary fill stage as described in more detail below with reference to a fifth stage (of FIG. 8) during fabrication of the integrated circuit device 100 of FIG. 1. In a particular implementation, the layer 133 may include a material (e.g., Al) doped with copper (Cu), e.g., 4% Cu doping. The layer 133 may be selectively deposited at a temperature of about 250° Celsius (C) as described below in more detail with reference to FIG. 8. The layer 135 may be non-selectively deposited during a second primary fill stage using a conformal deposition technique as described in more detail below with reference to a sixth stage (of FIG. 9) during fabrication of the integrated circuit device 100 of FIG. 1. The layer 137 may be deposited during a third primary fill stage using a deposition technique such as an in-situ PVD fill as described in more detail below with reference to a seventh stage (of FIG. 10) during fabrication of the integrated circuit device 100 of FIG. 1. The material of layer 137 of FIG. 1 may include or be formed of Al doped with Cu (e.g., about 4% Cu doping).

Although the primary fill material of the second metal layer 104 is illustrated as being formed using three primary fill stages to deposit the layers 133, 135, and 137, more than or less than three primary fill stages, and more than or less than three materials or layers, may be used to form the primary fill of the second metal layer 104. For example, the primary fill material of the second metal layer 104 may be formed using two primary fill stages to deposit two layers or materials. To illustrate, the primary fill of the second metal layer 104 may be formed by selectively depositing the layer 133 as described in more detail below with reference to FIG. 8. Subsequent to forming the layer 133 of FIG. 1, another material (e.g., Cu-doped Al) may be deposited (e.g., using a non-selective CVD process) during a second primary fill stage to fill the remaining dual damascene structure. For example, FIG. 3 may illustrate a first stage during fabrication of the integrated circuit device 100 of FIG. 1, and the non-selective CVD process of the second primary fill stage may fill any portions of the first opening 316 of FIG. 3, the second opening 318, and/or the third opening 320 that are unfilled upon performance of the first primary fill stage.

The integrated circuit device 100 of FIG. 1 includes an inter-diffusion layer 103 between the interconnect 113 and the first metal layer 102. The inter-diffusion layer 103 may include (or may be formed using) aluminum (Al) and a different conductive material, such as cobalt (Co) or Titanium (Ti). The inter-diffusion layer 103 may be (or may include portions that are) proximate to (e.g., in direct contact with) the first metal layer 102 and proximate to (e.g., in direct contact with) a layer (e.g., a seed layer) 119' of first material including aluminum. The inter-diffusion layer 103 may inhibit or prevent diffusion between the first metal layer 102 and at least a portion of the second metal layer 104, such as the interconnect 113. The inter-diffusion layer 103 may serve as an electromigration (EM) cap.

The inter-diffusion layer 103 may be formed at least in part by selectively depositing one or more layers of material (including aluminum) of the interconnect 113 proximate to conductive material of a conductive layer. The conductive layer may be selectively deposited (e.g., using a localized or area-selective deposition technique) proximate to an exposed portion of the first metal layer 102. For example, FIG. 5 may illustrate a third stage during fabrication of the integrated circuit device 100 of FIG. 1, and the conductive layer may correspond to, and may be formed as described with reference to formation of, the conductive layer 122 of FIG. 5. The inter-diffusion layer 103 of FIG. 1 may further be formed at least in part by selectively depositing layer 133 as described above and below with reference to FIG. 8. For example, the layer 133 of FIG. 1 may be selectively deposited at a temperature of about 250° C., and deposition of the layer 133 at the temperature of about 250° C. may cause aluminum (e.g., of the layer 119' and/or the layer 133) to interact with the conductive material (e.g., Co or Ti) of the conductive layer 122 of FIG. 5 to form the inter-diffusion layer 103 of FIG. 1. Thus, the inter-diffusion layer 103 may be formed of or may include an aluminum alloy, such as an aluminum cobalt alloy (e.g., $Al_9Co_2$), an aluminum titanium alloy, or a combination thereof. The inter-diffusion layer 103 may serve as an EM cap.

The integrated circuit device 100 may include a self-forming barrier layer 114. The self-forming barrier layer 114 may be (or may include portions that are) proximate to (e.g., in direct contact with) the layer 119' (or portions of the layer 119') and may be proximate to (e.g., in direct contact with) the dielectric layer 105 (or portions of the dielectric layer 105). For example, the self-forming barrier layer 114 may include portions located between (e.g., separating) portions of the layer 119' of the interconnect 113 and portions of the dielectric layer 105 proximate to the interconnect 113. Additionally or alternatively, the self-forming barrier layer 114 may be (or may include portions that are) proximate to (e.g., in direct contact with) the layer 119' of the second metal line 108 and proximate to (e.g., in direct contact with) the dielectric layer 105 (or portions of the dielectric layer 105). For example, the self-forming barrier layer 114 may include portions located between (e.g., separating) portions of the layer 119' of the second metal line 108 and portions of the dielectric layer 105 proximate to (e.g., surrounding) the second metal line 108. Additionally or alternatively, the self-forming barrier layer 114 may be (or may include portions that are) proximate to (e.g., in direct contact with) the layer 119' of the third metal line 112 and proximate to (e.g., in direct contact with) the dielectric layer 105 (or portions of the dielectric layer 105). For example, the self-forming barrier layer 114 may include portions located between (e.g., separating) portions of the layer 119' of the third metal line 112 and portions of the dielectric layer 105 proximate to (e.g., surrounding) the third metal line 112. The self-forming barrier layer 114 may serve as a diffusion barrier between aluminum of the interconnect 113 and the dielectric layer 105, between aluminum of the second metal line 108 and the dielectric layer 105, and between aluminum of the third metal line 112 and the dielectric layer 105.

Additionally, the self-forming barrier layer 114 may include portions located between (e.g., separating) the first airgap 109 and portions of the layer 119' of the interconnect 113 (e.g., of the first metal line 110) and/or may include portions located between (e.g., separating) the first airgap 109 and portions of the layer 119' of the second metal line 108. Additionally, the self-forming barrier layer 114 may include portions located between the second airgap 111 and portions of the layer 119' of the interconnect 113 (e.g., of the first metal line 110) and/or may include portions located between (e.g., separating) the second airgap 111 and portions of the layer 119' of the third metal line 112.

The self-forming barrier layer 114 may be formed of or may include an aluminum compound that forms via a chemical reaction that occurs in response to exposure of aluminum to material of the dielectric layer 105 (e.g., oxygen). As an example, the self-forming barrier layer 114 may be formed of or may include $Al_2O_3$. As an example, FIGS. 6 and 7 may illustrate a fourth stage during fabrication of the integrated circuit device 100 of FIG. 1 and the self-forming barrier layer 114 may form via a chemical reaction that occurs in response to exposure of aluminum of layer (e.g., a seed layer) 119 of FIG. 6 to material of the dielectric layer 105. To illustrate, the self-forming barrier layer 114 of the interconnect 113 of FIG. 1 may form via a chemical reaction that transforms portions of the layer 119 of FIG. 6 into the portions of the self-forming barrier layer 114 of the interconnect 113 of FIG. 1. Additionally, the self-forming barrier layer 114 of the second metal line 108 may form via a chemical reaction that transforms portions of the layer 119 of FIG. 6 into the portions of the self-forming barrier layer 114 of the second metal line 108. Additionally, the self-forming barrier layer 114 of the third metal line 112 may form via a chemical reaction that transforms portions of the layer 119 of FIG. 6 into the portions of the self-forming barrier layer 114 of the third metal line 112.

Thus, a diffusion barrier may be formed between the interconnect structure of the integrated circuit device 100 and the dielectric layer 105 without performing a dedicated diffusion barrier deposition process. Additionally, the self-forming barrier layer 114 may be relatively thin (as compared to conventional barrier layers) as a result of the nature of the aluminum oxidation reaction. Accordingly, the self-forming barrier layer 114 may allow for a larger conductive cross-sectional area for a same metal line width compared to copper metal lines (that require relatively thick dedicated barrier/liner layers).

Figure 2:
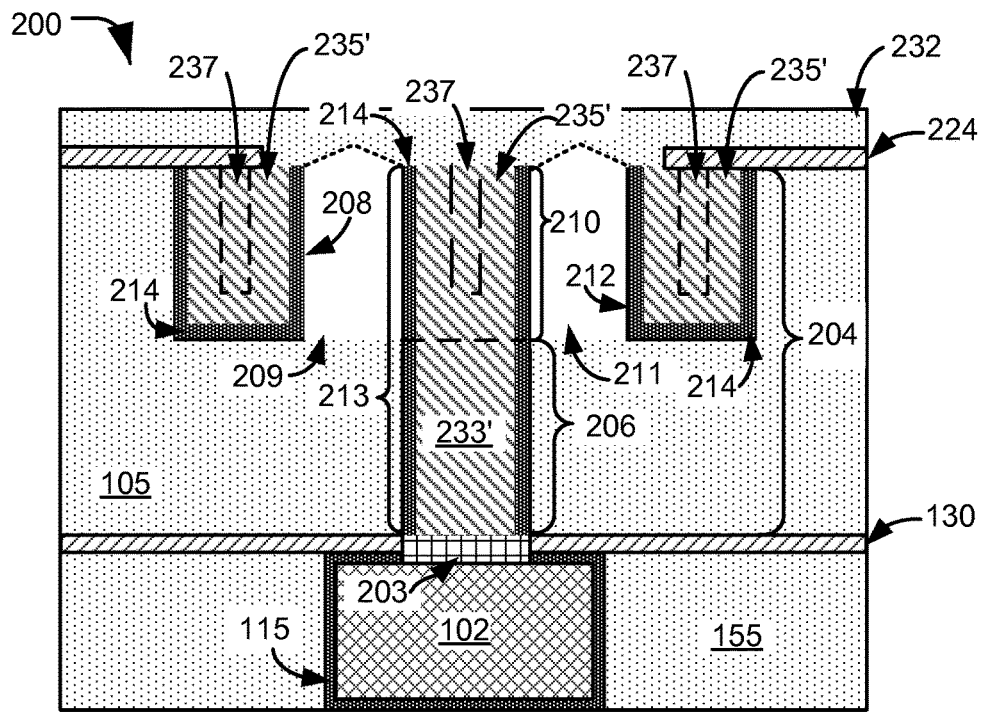
FIG. 2 is a side view of a device including an inter-diffusion layer and a self-forming barrier layer proximate to portions of one or more layers or primary fill material.

An integrated circuit device that includes aluminum lines, an inter-diffusion layer, and a self-forming barrier layer is generally illustrated as 200 in FIG. 2. Some compositionally or structurally similar layers, aspects, or features of the integrated circuit device 200 and of the integrated circuit device 100 of FIG. 1 may be labeled with the same reference number to avoid redundant description of the commonly numbered layers, aspects, or features. Use of common reference number to represent these layers, aspects, or features may indicate that commonly numbered layers, aspects, or features are the same layers, aspects, or features (e.g., not physically separate and/or not separately formed), or that the commonly numbered layers, aspects, or features are compositionally or structurally similar, yet separate (e.g., physically separate and/or separately formed).

The integrated circuit device 200 of FIG. 2 includes a first metal layer 102 and a dielectric layer 105 as described above with reference to the first metal layer 102 and the dielectric layer 105 of FIG. 1.

The integrated circuit device 200 of FIG. 2 further includes a second metal layer 204 that includes an interconnect structure formed of or including one or more materials that include aluminum. The interconnect structure may be formed in a dielectric layer 105. The interconnect structure may include an interconnect 213 including a via portion 206 and a first metal line 210 (e.g., a first BEOL metal line) coupled to the via portion 206. The first metal line 210 may include a layer 233' of first material including aluminum, a layer 235' of second material including aluminum, and/or a layer 237 of third material including aluminum. Additionally, the interconnect structure may include other metal line portions, such as a second metal line 208 (e.g., a second BEOL metal line) and a third metal line 212 (e.g., a third BEOL metal line).

One or more airgaps may separate portions of adjacent metal lines of the interconnect structure. For example, a first airgap 209 may be located between a portion of the first metal line 210 and a portion of the second metal line 208. Thus, the second metal line 208 may be separated from the first metal line 210 by the first airgap 209. As another example, a second airgap 211 may be located between a portion of the first metal line 210 and a portion of the third metal line 212. Thus, the third metal line 212 may be separated from the first metal line 210 by the second airgap 211. In a particular aspect, a distance between the first metal line 210 and the second metal line 208 may be about 12 to 15 nanometers (nm), and a distance between the first metal line 210 and the third metal line 212 may be about 12 to 15 nm. Thus, the first airgap 209 and/or the second airgap 211 may each have a width of about 12 to 15 nm.

The interconnect structure may be formed using a dual damascene process (e.g., a BEOL dual damascene process). For example, dielectric material of the dielectric layer 105 may be deposited; one or more openings may be formed in the dielectric material of the dielectric layer 105 using lithographic and/or etching techniques; and the second metal layer 204 may be formed by depositing one or more materials in the openings using a dual damascene deposition process as described in more detail with reference to FIGS. 3-5 and 17-28.

The second metal layer 204 of FIG. 2 includes a primary fill formed of one or more materials including aluminum. In some examples, the primary fill of the second metal layer 204 may be formed using three primary fill deposition stages. For example, the primary fill of the second metal layer 204 may be formed using the three primary fill deposition stages to deposit material of the layer 233', material of the layer 235', and material of the layer 237.

The material of the layer 233' may be selectively deposited (e.g., by CVD) in the first primary fill stage as described in more detail below with reference to a fourth stage (of FIG. 17) during fabrication of the integrated circuit device 200 of FIG. 2. The layer 233' may correspond to portions of a layer 233 of FIG. 17 that are not transformed into portions of the self-forming barrier layer 214 of FIG. 2. In a particular example, the layer 233' may include a material (e.g., Al) doped with copper (e.g., 4% Cu doping). The layer 233 of FIG. 17 may be selectively deposited at a temperature of about 250° Celsius (C).

The material of the layer 235' may be non-selectively deposited during a second primary fill stage using a conformal deposition technique as described in more detail below with reference to a fifth stage (of FIG. 19) during fabrication of the integrated circuit device 200 of FIG. 2. The layer 235' may correspond to portions of a layer 235 of FIG. 19 that are not transformed into portions of the self-forming barrier layer 214 of FIG. 2.

The layer 237 may be deposited during a third primary fill stage using a deposition technique such as an in-situ PVD fill as described in more detail below with reference to a sixth stage (of FIG. 21) during fabrication of the integrated circuit device 200 of FIG. 2. The material of layer 237 may include or be formed of aluminum doped with copper (e.g., about 4% copper doping).

Although the primary fill material of the second metal layer 204 is illustrated as being formed using three primary fill stages to deposit material of the layers 233', 235', and 237, more than or less than three primary fill stages, and more than or less than three materials or layers, may be used to form the primary fill of the second metal layer 204. For example, the primary fill material of the second metal layer 204 may be formed using two primary fill stages to deposit two layers or materials. To illustrate, the primary fill of the second metal layer 204 may be formed by selectively depositing the layer 233 as described below in more detail with reference to the fourth stage (of FIG. 17), followed by a non-selective CVD process (e.g., of copper-doped aluminum) during a second primary fill stage to fill the remaining dual damascene structure. For example, FIG. 3 may illustrate a first stage during fabrication of the integrated circuit device 200 of FIG. 2 and the non-selective CVD process of the second primary fill stage may fill any portions of the first opening 316 of FIG. 3, the second opening 318, and/or the third opening 320 that are unfilled upon performance of the first primary fill stage.

The integrated circuit device 200 of FIG. 2 includes an inter-diffusion layer 203 between the interconnect 213 and the first metal layer 102. The inter-diffusion layer 203 may include (or may be formed using) Al and a different conductive material, such as Co or Ti. The inter-diffusion layer 203 may be (or may include portions that are) proximate to (e.g., in direct contact with) the first metal layer 102 and proximate to (e.g., in direct contact with) a layer of first material including aluminum. For example, the inter-diffusion layer 203 may include portions that are in direct contact with the first metal layer 102 and in direct contact with the layer 233'. The inter-diffusion layer 203 may inhibit or prevent diffusion between the first metal layer 102 and at least a portion of the second metal layer 204, such as the interconnect 213. The inter-diffusion layer 203 may serve as an electromigration (EM) cap.

The inter-diffusion layer 203 may be formed at least in part by selectively depositing (e.g., using a selective deposition technique) material including aluminum proximate to conductive material (e.g., Co or Ti) of a conductive layer. For example, FIG. 5 may illustrate a third stage during formation of the integrated circuit device 200 of FIG. 2, and the conductive layer may correspond to, and may be formed as described with reference to formation of, the conductive layer 122 of FIG. 5. The inter-diffusion layer 203 may further be formed at least in part by selectively depositing material of layer 233' as described in more detail below with reference to the fourth stage of FIGS. 17 and 18. For example, the layer 233 of FIG. 17 may be selectively deposited at about 250° C., and deposition of the layer 233 at the temperature of about 250° may cause aluminum of the layer 233 to interact with the conductive material (e.g., Co or Ti) of the conductive layer 122 to form the inter-diffusion layer 203 of FIG. 2. Thus, the inter-diffusion layer 203 may be formed of or may include an aluminum alloy, such as an aluminum cobalt alloy (e.g., $Al_9Co_2$), an aluminum titanium alloy, or a combination thereof. The inter-diffusion layer 203 may serve as an EM cap.

The integrated circuit device 200 may include a self-forming barrier layer 214. The self-forming barrier layer 214 may be (or may include portions that are) proximate to (e.g., in direct contact with) the layer 233' and proximate to (e.g., in direct contact with) the dielectric layer 105 (or portions of the dielectric layer 105). For example, the self-forming barrier layer 214 may include portions located between (e.g., separating) portions of the layer 233' and portions of the dielectric layer 105 proximate to (e.g., surrounding) the interconnect 213. Additionally or alternatively, the self-forming barrier layer 214 may be (or may include portions that are) proximate to (e.g., in direct contact with) the layer 235' of the second metal line 208 and proximate to (e.g., in direct contact with) the dielectric layer 105 (or portions of the dielectric layer 105). For example, the self-forming barrier layer 214 may include portions located between (e.g., separating) portions of the layer 235' of the second metal line 208 and portions of the dielectric layer 105 proximate to (e.g., surrounding) the second metal line 208. Additionally or alternatively, the self-forming barrier layer 214 may be (or may include portions that are) proximate to (e.g., in direct contact with) the layer 235' of the third metal line 212 and proximate to (e.g., in direct contact with) the dielectric layer 105 (or portions of the dielectric layer 105). For example, the self-forming barrier layer 214 may include portions located between (e.g., separating) portions of the layer 235' of the third metal line 212 and portions of the dielectric layer 105 proximate to (e.g., surrounding) the third metal line 212. The self-forming barrier layer 214 may serve as a diffusion barrier between aluminum of the interconnect 213 and the dielectric layer 105, between aluminum of the second metal line 208 and the dielectric layer 105, and between aluminum of the third metal line 212 and the dielectric layer 105.

Additionally, the self-forming barrier layer 214 may include portions located between (e.g., separating) the first airgap 209 and portions of the layer 233' or the layer 235' of the interconnect 213, and/or may include portions located between (e.g., separating) the first airgap 209 and portions of the layer 235' of the second metal line 208. Additionally, the self-forming barrier layer 214 may include portions located between the second airgap 211 and portions of the layer 233' or the layer 235' of the interconnect 213, and/or may include portions located between (e.g., separating) the second airgap 211 and portions of the layer 235' of the third metal line 212.

The self-forming barrier layer 214 may be formed of or may include an aluminum compound that forms via a chemical reaction that occurs in response to exposure of aluminum to material of the dielectric layer 105. For example, FIGS. 17-20 may illustrate stages of forming the integrated circuit device 200 of FIG. 2, and the self-forming barrier layer 214 may form via a chemical reaction that occurs in response to exposure of aluminum of the layers 233 and 235 of FIGS. 17 and 19 with material of the dielectric layer 105.

Figure 17:
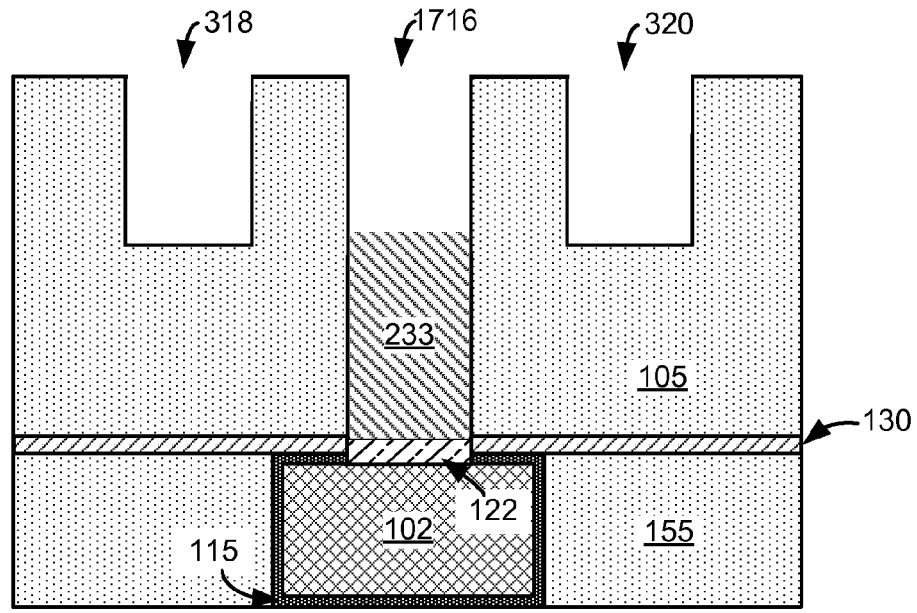
FIGS. 17 and 18 illustrate a fourth stage of a process of fabricating the device of FIG. 2.
Figure 18:
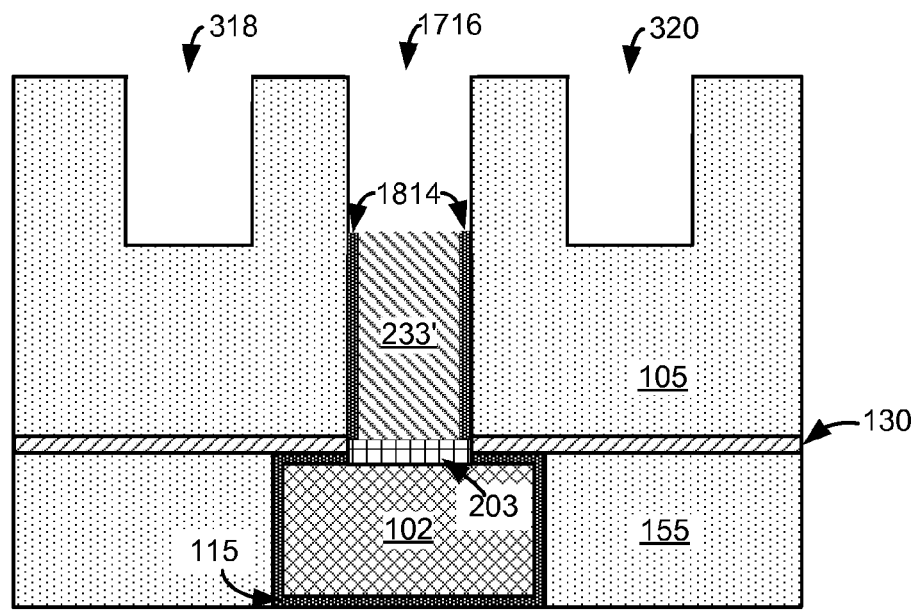

For example, portions of the self-forming barrier layer 214 of the interconnect 213 may form via a chemical reaction that transforms portions of the layer 233 of FIG. 17 into self-forming barrier 1814 of FIG. 18. The self-forming barrier 1814 of FIG. 18 may correspond to portions of the self-forming barrier layer 214 of the via portion 206 of FIG. 2. Additionally, portions of the self-forming barrier layer 214 may form via a chemical reaction that transforms portions of the layer 235 of FIG. 19 into self-forming barrier 2014 of FIG. 20. The self-forming barrier 2014 may correspond to portions of the self-forming barrier layer 214 of the first, second, and third metal lines 210, 208, and 212 of FIG. 2.

Thus, a diffusion barrier may be formed between the interconnect structure of the integrated circuit device 200 and the dielectric layer 105 without performing a dedicated diffusion barrier deposition process. Additionally, the self-forming barrier layer 214 may be relatively thin (as compared to conventional barrier layers) as a result of the nature of the aluminum oxidation reaction. Accordingly, the self-forming barrier layer 214 may allow for a larger conductive cross-sectional area for a same metal line width compared to copper metal lines (that require relatively thick dedicated barrier/liner layers).

FIGS. 3-16 (in conjunction with FIG. 1) illustrate stages during fabrication of a device including an inter-diffusion layer and a self-forming diffusion barrier. For example, the illustrative stages of 3-16 may be used to fabricate the integrated circuit device 100 of FIG. 1.

Figure 3:
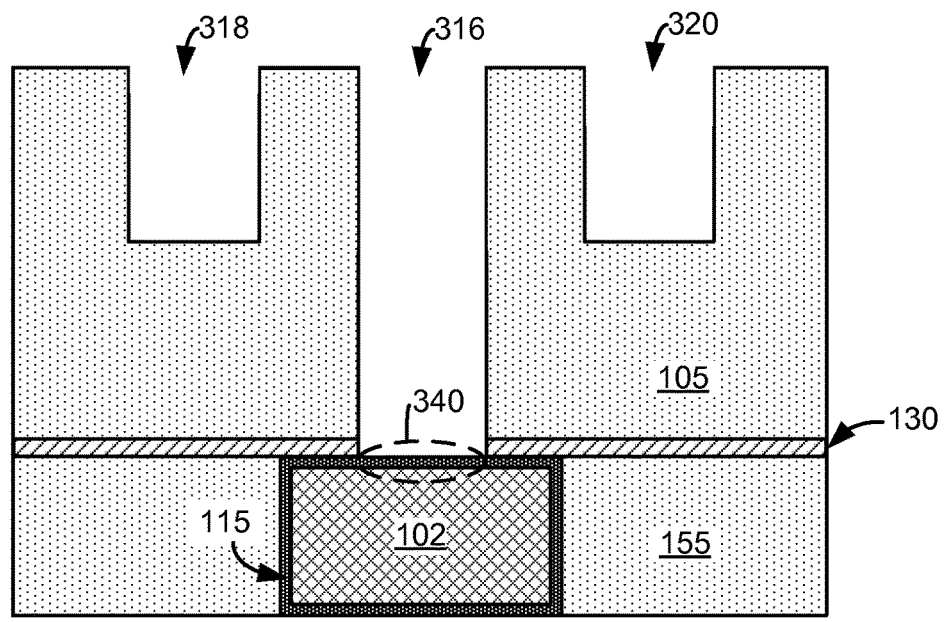
FIG. 3 illustrates a first stage of a process of fabricating the device of FIG. 1 or the device of FIG. 2.

FIG. 3 may illustrate a first stage during fabrication of the integrated circuit device 100 of FIG. 1. The first stage of FIG. 3 may include depositing dielectric material of dielectric layer 155, etching an opening [not illustrated], and depositing material of metal layer 102 into the opening. The metal layer 102 may be formed of or include Al. The Al deposited to form the metal layer 102 may chemically react with material of the dielectric layer 155 (e.g., oxygen) or air to form the self-forming barrier layer 115. The first stage of FIG. 3 may further include depositing an inter-layer barrier 130. The inter-layer barrier 130 may be formed of or include Al nitride (e.g., AlN).

The first stage of FIG. 3 further includes performing a dual damascene etch to form a first opening 316, a second opening 318, and a third opening 320. For example, the dielectric material of the dielectric layer 105 may be deposited on the inter-layer barrier 130. A patterned photoresist layer [not illustrated] may be formed on the dielectric layer 105. The patterned photoresist layer may include a negative pattern. The dielectric layer 105 may be etched according to the negative pattern of the photoresist layer to form the first opening 316, the second opening 318, and the third opening 320. The dielectric layer 105 may be etched using an etchant that does not etch through material of the self-forming barrier layer 115 of the first metal layer 102. For example, the self-forming barrier layer 115 may be formed of or include $Al_2O_3$, and the etchant may exhibit a low etch rate with respect to $Al_2O_3$. Forming the first opening may expose a portion 340 of the self-forming barrier layer 115.

Figure 4:
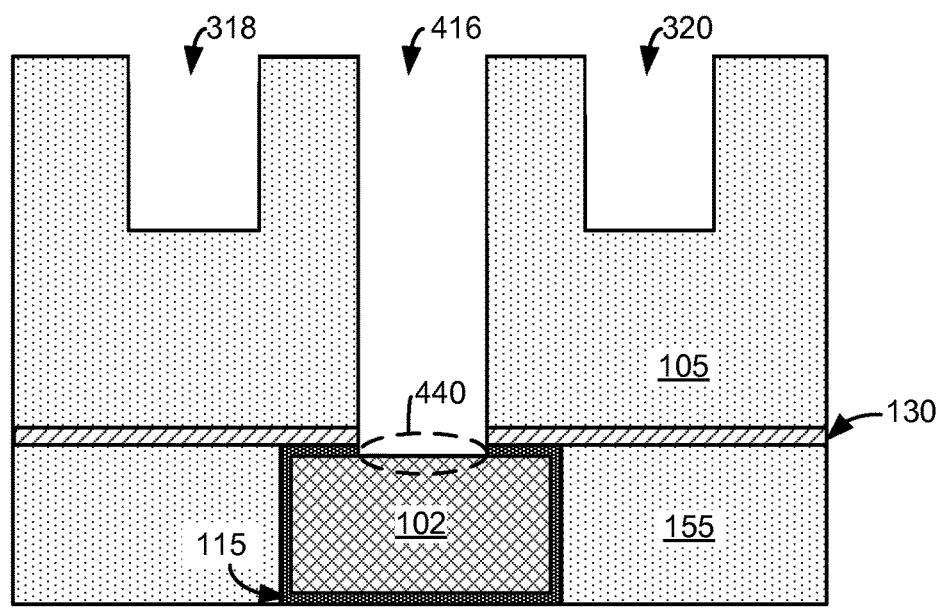
FIG. 4 illustrates a second stage of a process of fabricating the device of FIG. 1 or the device of FIG. 2.

FIG. 4 may illustrate a second stage during fabrication of the integrated circuit device 100 of FIG. 1. The second stage may be performed after the first stage. The second stage of FIG. 4 includes removing the portion 340 of the self-forming barrier layer 115 of FIG. 3. The portion 340 of the self-forming barrier layer 115 may be removed using an in-situ H radical treatment. Removing the portion 340 of the self-forming barrier layer 115 proximate to the first opening 316 may expose a portion 440 of the first metal layer 102 of FIG. 4 and may result in a first modified first opening 416.

Figure 5:
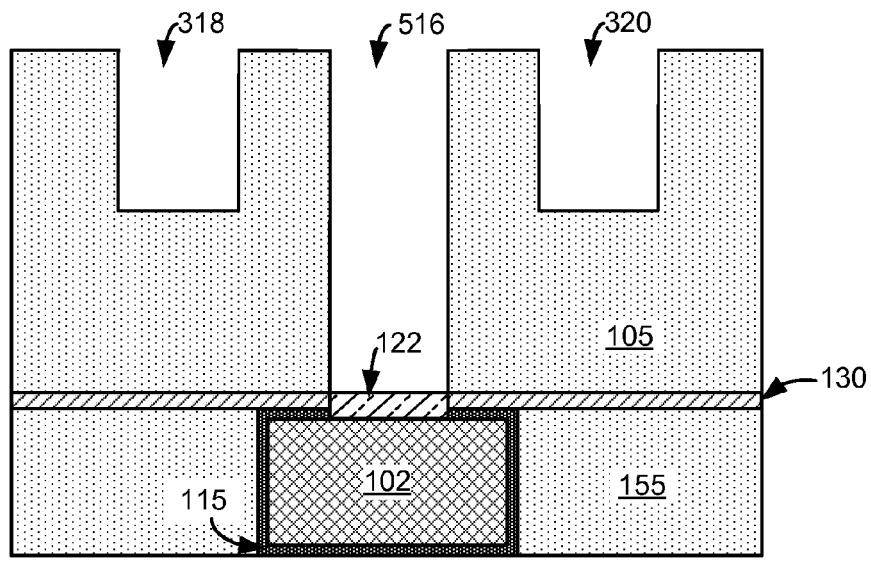
FIG. 5 illustrates a third stage of a process of fabricating the device of FIG. 1 or the device of FIG. 2.

FIG. 5 may illustrate a third stage during fabrication of the integrated circuit device 100 of FIG. 1. The third stage may be performed after the second stage (e.g., after the portion 340 of FIG. 3 of the self-forming barrier layer 115 has been removed). The third stage of FIG. 5 includes selectively forming (e.g., via a localized or area-selective deposition technique) the conductive layer 122 in the first modified first opening 416 of FIG. 4 proximate to the exposed portion 440 of the first metal layer 102. The conductive layer 122 of FIG. 5 may be selectively formed in the first modified first opening 416 of FIG. 4 such that the conductive layer 122 of FIG. 5 is not formed on at least a portion of sidewalls of the first modified first opening 416 of FIG. 4 and/or is not formed outside of the first modified first opening 416.

The conductive layer 122 of FIG. 5 may be selectively deposited proximate to the exposed portion 440 of the first metal layer 102 of FIG. 5 using a localized or area-selective deposition technique or process, such as a CVD technique. In some examples, the conductive layer 122 may be formed of or may include any conductive material (e.g., any metal) that is suitable for localized or area-selective deposition in the first modified first opening 416 of FIG. 4 proximate to the exposed portion 440 of the first metal layer 102, that will form a metal alloy or compound with aluminum, and that will not actively diffuse. The conductive material of the conductive layer 122 of FIG. 5 may be suitable for localized or area-selective deposition in the first modified first opening 416 of FIG. 4 when the material of the conductive layer 122 of FIG. 5 can be deposited on the exposed portion 440 of FIG. 4 without depositing the material of the conductive layer 122 of FIG. 5 on sidewalls of the first modified first opening 416 of FIG. 4 and/or outside of the first modified first opening 416. In some examples, the conductive material of the conductive layer 122 of FIG. 5 may include Co or Ti. In a particular implementation, the conductive layer 122 has a thickness of about 1 nm. Forming the conductive layer 122 in the first modified first opening 416 of FIG. 4 may form a second modified first opening 516 of FIG. 5.

Figure 6:
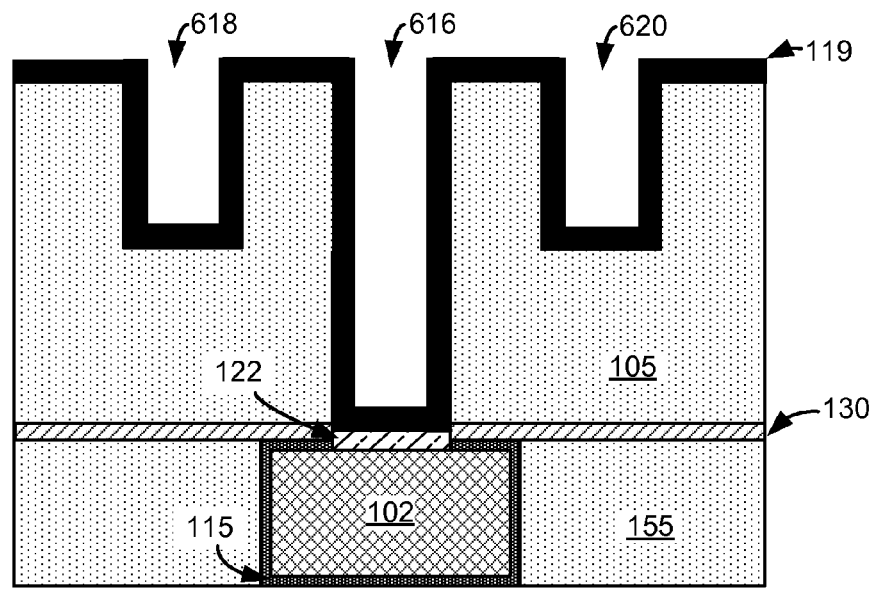
FIGS. 6 and 7 illustrate a fourth stage of a process of fabricating the device of FIG. 1.
Figure 7:
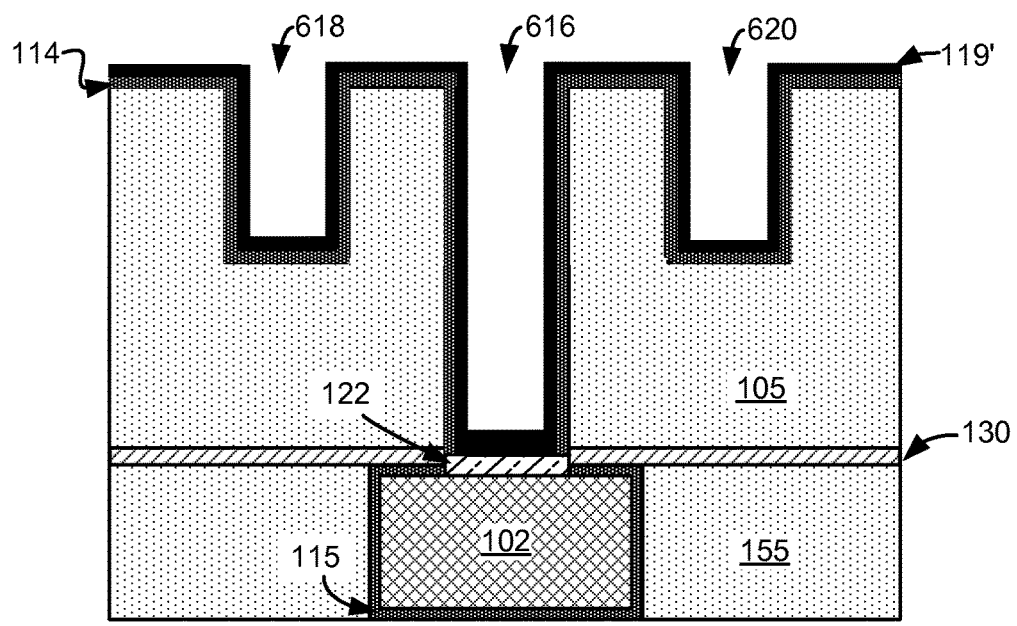

FIGS. 6 and 7 illustrate a fourth stage during fabrication of the integrated circuit device 100 of FIG. 1. The fourth stage may be performed after the third stage. The fourth stage of FIGS. 6 and 7 includes forming the layer 119 of FIG. 6 in the second modified first opening 516 of FIG. 5, in the second opening 318, and in the third opening 320. For example, the layer 119 of FIG. 6 may be formed in the second modified first opening 516 of FIG. 5 proximate to (e.g., in direct contact with) exposed portions of the conductive layer 122 and proximate to (e.g., in direct contact with) exposed portions of the dielectric layer 105 defining sidewalls of the second modified first opening 516. Additionally or alternatively, the layer 119 of FIG. 6 may be formed in the second opening 318 of FIG. 5 proximate to (e.g., in direct contact with) exposed portions of the dielectric layer 105 defining sidewalls and/or a first surface (e.g., a lower surface) of the second opening 318. Additionally or alternatively, the layer 119 of FIG. 6 may be formed in the third opening 320 of FIG. 5 proximate to (e.g., in direct contact with) portions of the dielectric layer 105 defining sidewalls and/or a first surface (e.g., a lower surface) of the third opening 320. The layer 119 of FIG. 6 may be formed of or may include aluminum.

The self-forming barrier layer 114 of FIG. 7 may form in response to a chemical reaction between the aluminum of portions of the layer 119 of FIG. 6 and the dielectric material of the dielectric layer 105. The chemical reaction may transform portions of the layer 119 into the self-forming barrier layer 114 of FIG. 7 while leaving other portions of the layer 119 of FIG. 6 unchanged. The layer 119' of FIG. 7 may correspond to portions of the layer 119 of FIG. 6 that remain substantially (or completely) unchanged (e.g., that do not undergo a chemical reaction with dielectric material of the dielectric layer 105). For example, portions of the layer 119 of FIG. 6 deposited in the second modified first opening 516 of FIG. 5 may be transformed into portions of the self-forming barrier layer 114 of the interconnect 113 of FIG. 1 via chemical reaction between the portions of the layer 119 of FIG. 6 deposited in the second modified first opening 516 of FIG. 5 and exposed portions of the dielectric layer 105 defining portions of the second modified first opening 516 of FIG. 5. Additionally, portions of the layer 119 of FIG. 6 deposited in the second opening 318 of FIG. 5 may be transformed into portions of the self-forming barrier layer 114 of the second metal line 108 of FIG. 1 via a chemical reaction between portions of the layer 119 of FIG. 6 deposited in the second opening 318 of FIG. 5 and exposed portions of the dielectric layer 105 defining the second opening 318. Additionally, portions of the layer 119 of FIG. 6 deposited in the third opening 320 of FIG. 5 may be transformed into portions of the self-forming barrier layer 114 of the third metal line 112 of FIG. 1 via a chemical reaction between portions of the layer 119 of FIG. 6 deposited in the third opening 320 of FIG. 5 and exposed portions of the dielectric layer 105 defining the third opening 320.

The layer 119' of FIG. 7 may promote smooth deposition (e.g., via CVD) of a material including aluminum. For example, when primary fill of the second metal layer 104 of FIG. 1 is formed using three primary fill stages and three materials as described above, the layer 119' may promote smooth CVD of the layers 133 and 135 of FIGS. 1 and 8-16. Alternatively, when the primary fill is formed using two primary fill stages and two materials as described above, the layer 119' of FIG. 7 may promote smooth CVD of the layer 133 of FIGS. 1 and 8-16 and may promote smooth CVD of a doped aluminum material (e.g., 4% Cu doping) to fill remaining portions of the first opening 316 of FIG. 3 and to fill the second and third openings 318 and 320.

Forming the layer 119 of FIG. 6 or the layer 119' of FIG. 7 in the second modified first opening 516 of FIG. 5 may result in a third modified first opening 616 of FIGS. 6 and 7. Forming the layer 119 of FIG. 6 or the layer 119' of FIG. 7 in the second opening 318 of FIG. 5 may result in a first modified second opening 618 of FIGS. 6 and 7. Additionally, forming the layer 119 of FIG. 6 or the layer 119' of FIG. 7 in the third opening 320 of FIG. 5 may result in a first modified third opening 620 of FIGS. 6 and 7.

Figure 8:
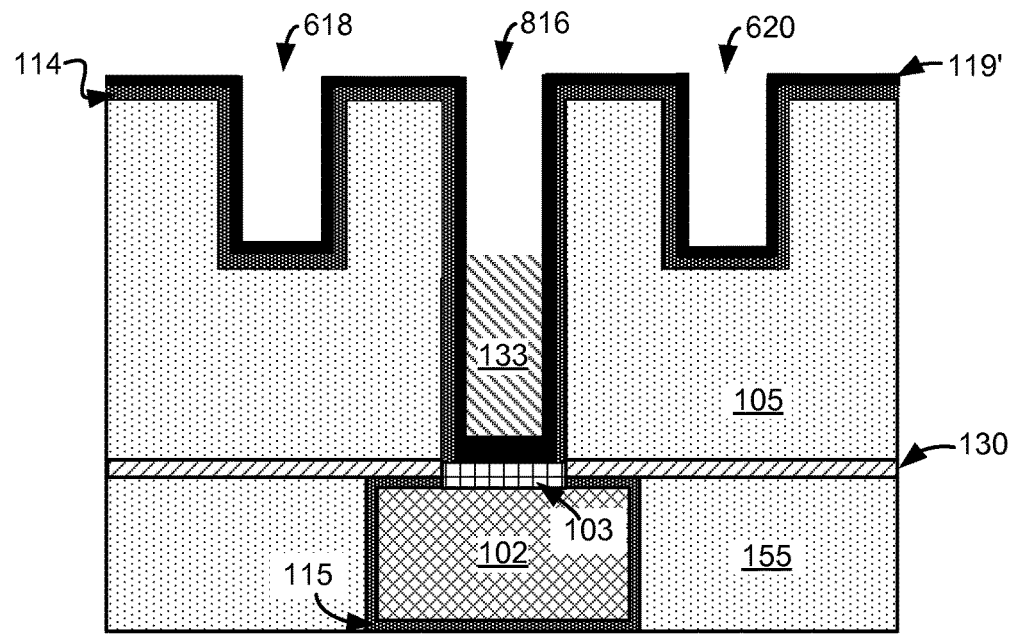
FIG. 8 illustrates a fifth stage of a process of fabricating the device of FIG. 1.

FIG. 8 illustrates a fifth stage during fabrication of the integrated circuit device 100 of FIG. 1. The fifth stage may be performed after the fourth stage. The fifth stage of FIG. 8 includes selectively forming (e.g., via a localized or area-selective deposition technique) the layer 133 in the third modified first opening 616 of FIG. 7. The layer 133 of FIG. 8 may be selectively formed using a localized or area-selective deposition technique, such as a CVD technique. The layer 133 of FIG. 8 may be selective formed in the third modified first opening 616 of FIG. 7 by selectively depositing material of the layer 133 in the third modified first opening 616 of FIG. 7 proximate to (e.g., in direct contact with) at least a portion of the layer 119' defining the third modified first opening 616 of FIG. 7. Selectively depositing the layer 133 of FIG. 8 in the third modified first opening 616 of FIG. 7 may result in a fourth modified first opening 816 of FIG. 8.

The material of layer 133 may be selectively deposited at a temperature of about 250° Celsius (C). Deposition of the material of the layer 133 at about 250° C. may cause aluminum to interact with the conductive material (e.g., Co or Ti) of the conductive layer 122 of FIG. 7 to form a metal alloy of the inter-diffusion layer 103 of FIG. 8. For example, aluminum of the layer 119' and aluminum of the first metal layer 102 may interact with the conductive material (e.g., Co or Ti) of the conductive layer 122 of FIG. 7 to form the inter-diffusion layer 103 of FIG. 8. As an example, when the conductive layer 122 of FIG. 7 is formed of or includes Co, aluminum of the layer 119' of FIG. 8 and/or or aluminum of the layer 133 may interact with the Co to form the inter-diffusion layer 103 that includes aluminum and cobalt. In this example, the inter-diffusion layer 103 may be formed of or include $Al_9Co_2$. The inter-diffusion layer 103 may serve as an EM cap.

Figure 9:
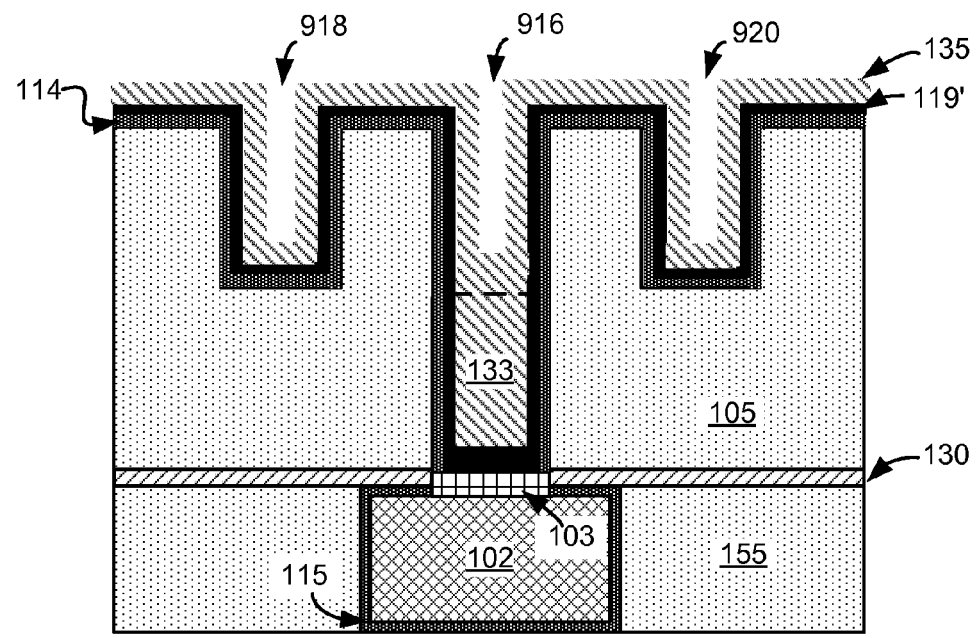
FIG. 9 illustrates a sixth stage of a process of fabricating the device of FIG. 1.

FIG. 9 illustrates a sixth stage during fabrication of the integrated circuit device 100 of FIG. 1. The sixth stage may be performed after the fifth stage. The sixth stage of FIG. 9 includes forming the layer 135. For example, the layer 135 may be formed by non-selectively depositing material of the layer 135 in the fourth modified first opening 816 of FIG. 8, in the first modified second opening 618, and in the first modified third opening 620. The material of the layer 135 of FIG. 9 may include aluminum.

In some examples, the material of the layer 135 may be non-selectively deposited using a non-selective conformal CVD technique to deposit the material of the layer 135 proximate to exposed portions of the layer 119' and proximate to exposed portions of the layer 133. For example, the material of the layer 135 may be non-selectively deposited proximate to exposed portions of the layer 119' in the fourth modified first opening 816 of FIG. 8, in the first modified second opening 618, and in the first modified third opening 620, and proximate to exposed portions of the layer 133 in the fourth modified first opening 816. Forming the layer 135 of FIG. 9 may result in a fifth modified first opening 916, a second modified second opening 918, and a second modified third opening 920.

In some examples, portions of the first opening 316 of FIG. 3, the second opening 318, and the third opening 320 may remain unfilled upon formation of the layer 135 of FIG. 9. In these examples, the layer 135 may serve as a seed layer to promote subsequent deposition of a dual damascene fill using physical vapor deposition (PVD). Thus, the first, second and third openings 316, 318, and 320 of FIG. 3 may be partially filled during the sixth stage of FIG. 9.

Alternatively, as described above, two primary fill stages may be used to form the primary fill of the first, second, and/or third metal lines 110, 108, and 112 of FIG. 1 and deposition of a third primary fill material as described below with reference to FIG. 10 may be omitted. When two primary fill stages are used to form the primary fill of the second metal layer 104 of FIG. 1, the layer 135 may include copper-doped aluminum (e.g., about 4% Cu), and the second stage of forming the primary fill (e.g., the sixth stage of FIG. 9) may include completely filling portions of the first, second, and third openings 316, 318, and 320 of FIG. 3 that remain to be filled after performance of the fifth state of FIG. 8. In this example, the layer 135 of FIG. 9 may be deposited using a CVD technique. Thus, the first, second, and third openings 316, 318, and 320 of FIG. 3 may be completely filled during the sixth stage of FIG. 9.

Figure 10:
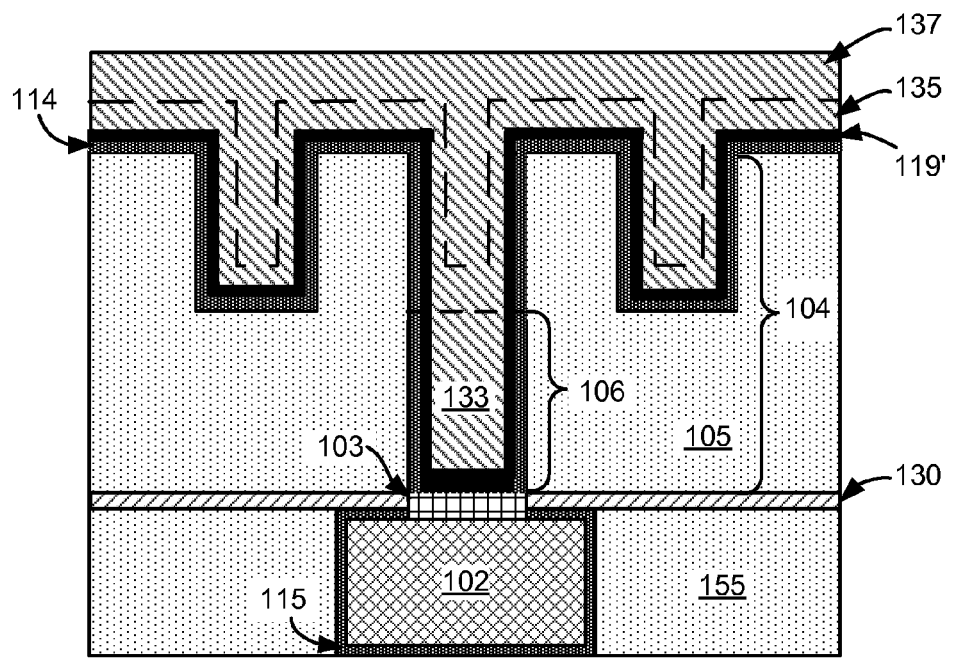
FIG. 10 illustrates a seventh stage of a process of fabricating the device of FIG. 1.

FIG. 10 illustrates a seventh stage during fabrication of the integrated circuit device 100 of FIG. 1. The seventh stage may be performed after the sixth stage. When three primary fill stages are used to form the primary fill of the second metal layer 104 as described above, the seventh stage of FIG. 10 includes forming the layer 137 and performing a reflow process on material of the second metal layer 104. For example, the material of the layer 137 may be deposited in the fifth modified first opening 916 of FIG. 9, in the second modified second opening 918, and in the second modified third opening 920 proximate to exposed portions of the layer 135. In some examples, the layer 137 of FIG. 10 may be formed using an in-situ PVD technique. The material of the layer 137 may include copper-doped aluminum.

Alternatively, when only two primary fill stages are used to form the primary fill of the second metal layer 104 of FIG. 1 as described above, the seventh stage includes performing the reflow process on the second metal layer 104 and may not include forming the layer 137 of FIG. 10.

The reflow process may include performing a reflow technique on material of the second metal layer 104 that includes aluminum (e.g., the layer 119', the layer 133, the layer 135, and/or the layer 137). The reflow process may be performed at about 400° C. The reflow process may remove point intersections of grain boundaries (e.g., triple points) in material of the second metal layer 104 that includes aluminum (e.g., the layer 119', the layer 133, the layer 135, and/or the layer 137), thereby improving EM behavior of the second metal layer 104.

Figure 11:
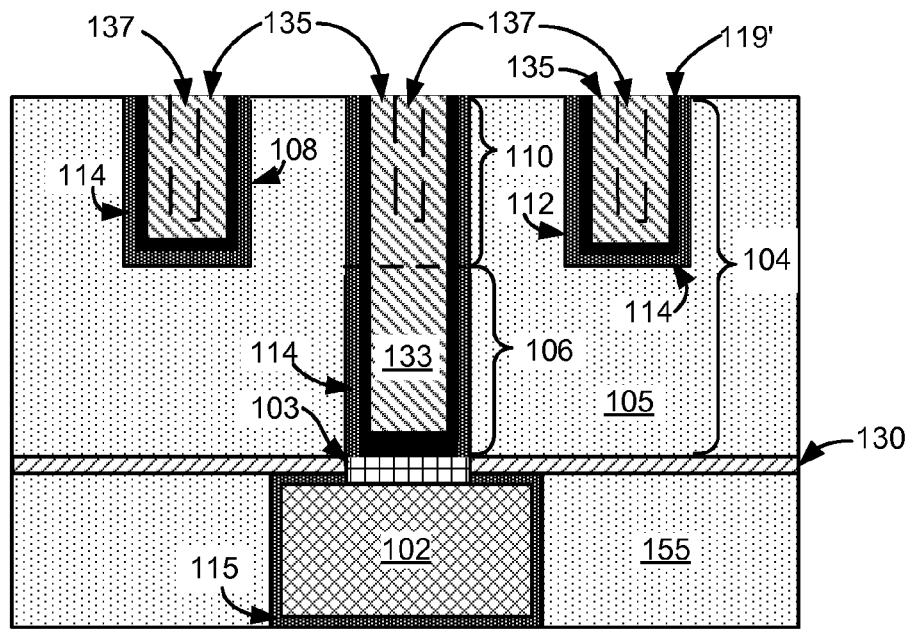
FIG. 11 illustrates an eighth stage of a process of fabricating the device of FIG. 1.

FIG. 11 illustrates an eighth stage during fabrication of the integrated circuit device 100 of FIG. 1. The eighth stage may be performed after the seventh stage. The eighth stage may include planarizing (e.g., by chemical mechanical planarization (CMP)) on portions of the layer 119', portions of the self-forming barrier layer 114, portions of the layer 135, and/or portions of layer 137 of FIG. 10 stopping on the dielectric layer 105.

Figure 12:
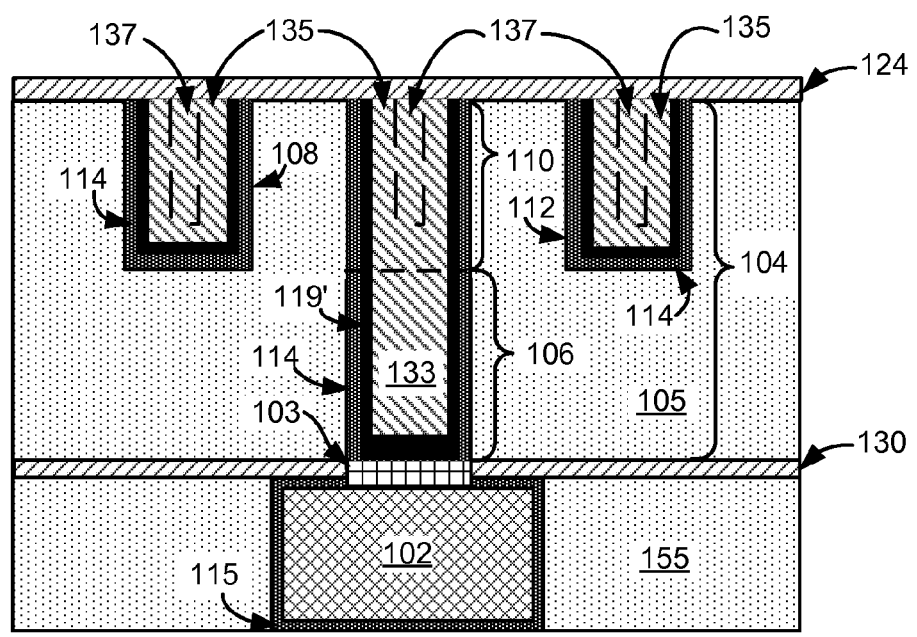
FIG. 12 illustrates a ninth stage of a process of fabricating the device of FIG. 1.

FIG. 12 illustrates a ninth stage during fabrication of the integrated circuit device 100 of FIG. 1. The ninth stage may be performed after the eighth stage. The ninth stage may include depositing an etch stop layer 124 proximate to the dielectric layer 105. The etch stop layer 124 may be formed of or include AlN.

Figure 13:
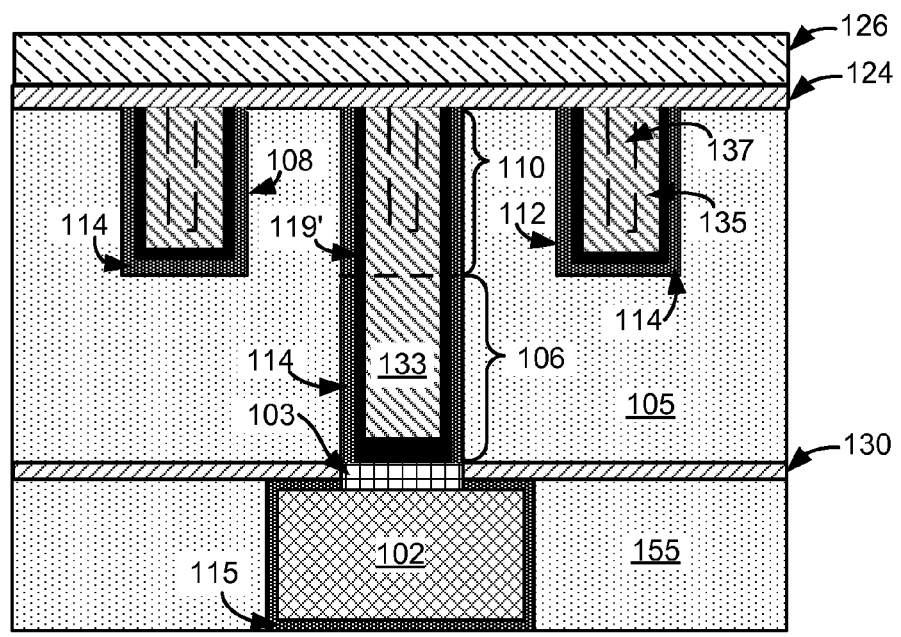
FIG. 13 illustrates a tenth stage of a process of fabricating the device of FIG. 1.

FIG. 13 illustrates a tenth stage during fabrication of the integrated circuit device 100 of FIG. 1. The tenth stage may be performed after the ninth stage. The tenth stage may include forming a photoresist layer 126 proximate to the etch stop layer 124.

Figure 14:
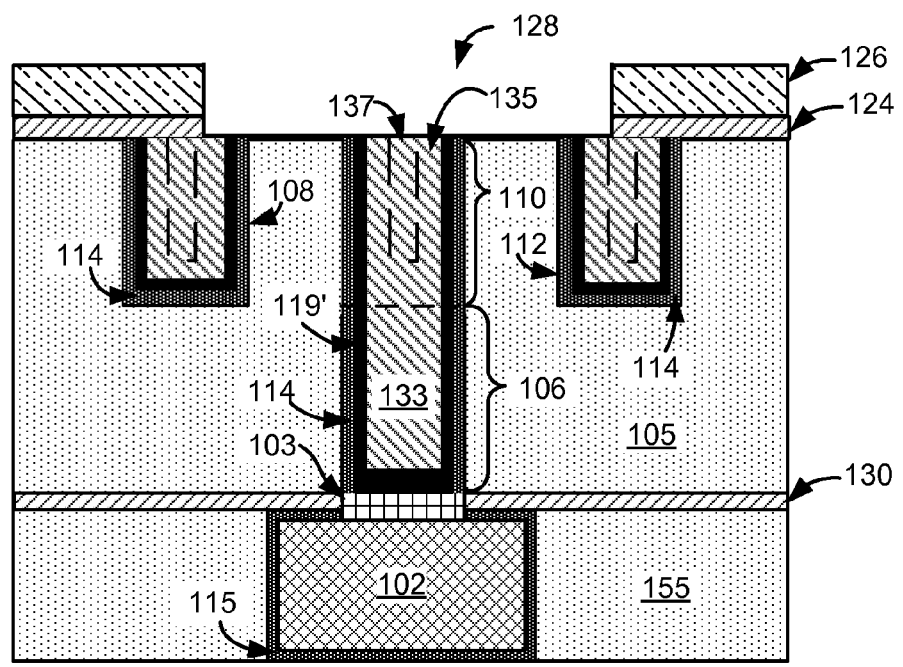
FIG. 14 illustrates an eleventh stage of a process of fabricating the device of FIG. 1.

FIG. 14 illustrates an eleventh stage during fabrication of the integrated circuit device 100 of FIG. 1. The eleventh stage may be performed after the tenth stage. The eleventh stage may include patterning the photoresist layer 126 and transferring the pattern to the etch stop layer 124 to form the opening 128. The pattern of the photoresist layer 126 may be transferred to the etch stop layer 124 by etching the etch stop layer 124 isotropically (e.g., using wet chemical etching) or anisotropically.

Figure 15:
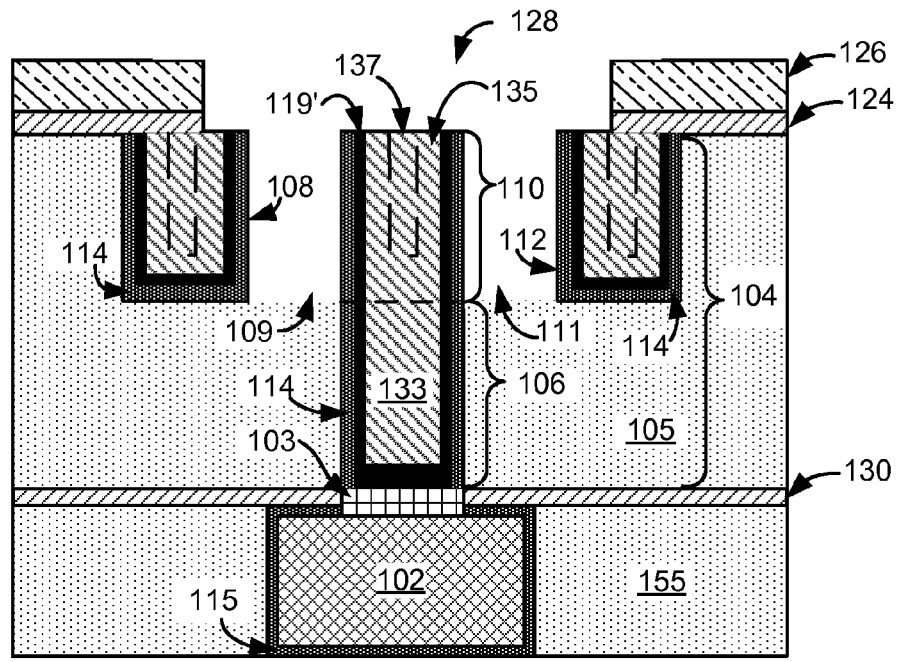
FIG. 15 illustrates a twelfth stage of a process of fabricating the device of FIG. 1.

FIG. 15 illustrates a twelfth stage during fabrication of the integrated circuit device 100 of FIG. 1. The twelfth stage may be performed after the eleventh stage. The twelfth stage may include etching the dielectric layer 105 through the opening 128 to form the first airgap 109 and the second airgap 111. The dielectric layer 105 may be etched through the opening 128 isotropically (e.g., using wet chemical etching) or anisotropically.

Figure 16:
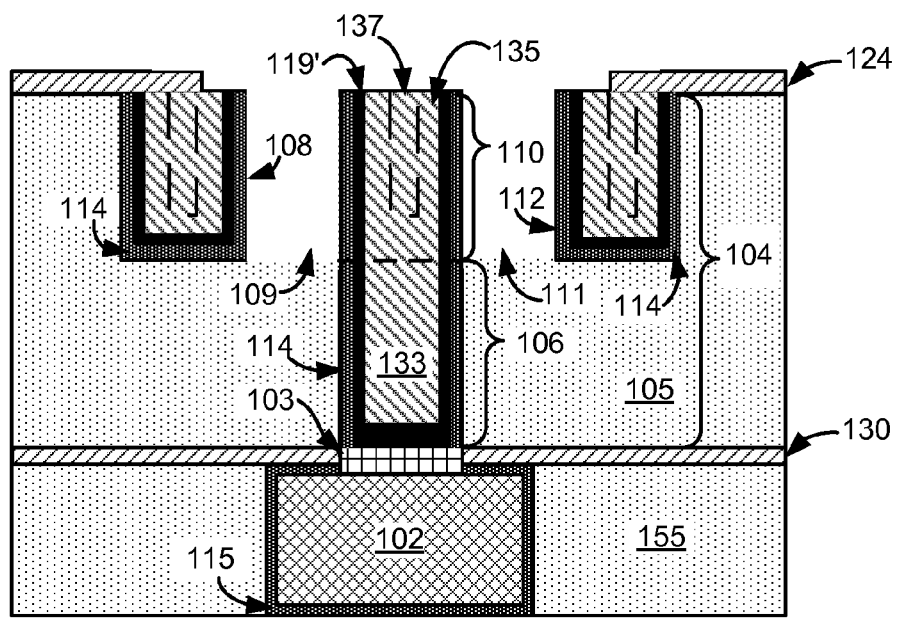
FIG. 16 illustrates a thirteenth stage of a process of fabricating the device of FIG. 1.

FIG. 16 illustrates a thirteenth stage during fabrication of the integrated circuit device 100 of FIG. 1. The thirteenth stage may be performed after the twelfth stage. The thirteenth stage may include removing remaining portions of the photoresist layer 126 of FIG. 15 and performing a post-etch clean (e.g., a wet clean or a dry clean) to remove etch polymer.

Turning back to FIG. 1, a fourteenth stage during fabrication of the integrated circuit device 100 is illustrated. The fourteenth stage may be performed after the thirteenth stage. The fourteenth stage may include sealing the first and second airgaps 109 and 111 by depositing (e.g., using a non-conformal deposition technique) a dielectric material 132 (e.g., a low-K dielectric material) proximate to (e.g., on, above, or over) the etch stop layer 124.

FIGS. 3-5 and 17-27 (in conjunction with FIG. 2) illustrate stages during fabrication of a device including an inter-diffusion layer and a self-forming diffusion barrier. For example, the illustrative stages of 3-5 and 17-27 may be used to fabricate the integrated circuit device 200 of FIG. 2. FIGS. 3-5 may illustrate first, second, and third stages during fabrication of the integrated circuit device 200 of FIG. 2 and may correspond to, or may be performed as described above with reference to, the first, second, and third stages during fabrication of the integrated circuit device 100 of FIG. 1.

FIGS. 17 and 18 illustrate a fourth stage during fabrication of the integrated circuit device 200 of FIG. 2. The fourth stage may be performed after the third stage. The fourth stage of FIGS. 17 and 18 includes selectively forming (e.g., via a localized or area-selective deposition technique) the layer 233 of FIG. 17 in the second modified first opening 516 of FIG. 5. The layer 233 of FIG. 17 may be selectively formed in the second modified first opening 516 of FIG. 5 using a localized or area-selective deposition technique, such as a CVD technique. The layer 233 of FIG. 17 may be selectively formed by selectively depositing material of the layer 233 of FIG. 17 in the second modified first opening 516 of FIG. 5 proximate to (e.g., in direct contact with) exposed portions of the conductive layer 122 and proximate to (e.g., in direct contact with) exposed portions of the dielectric layer 105 defining sidewalls of the second modified first opening 516.

A self-forming barrier 1814 of FIG. 18 may form in response to a chemical reaction between the aluminum of portions of the layer 233 of FIG. 17 and the dielectric material of the dielectric layer 105. The self-forming barrier 1814 may correspond to portions of the self-forming barrier layer 214 of FIG. 2 of the interconnect 213. The chemical reaction may transform portions of the layer 233 of FIG. 17 into the self-forming barrier 1814 of FIG. 18 while leaving other portions of the layer 233 of FIG. 17 unchanged. The layer 233' of FIG. 18 may correspond to portions of the layer 233 of FIG. 17 that remain substantially (or completely) unchanged (e.g., that do not undergo a chemical reaction with dielectric material of the dielectric layer 105). For example, portions of the layer 233 of FIG. 17 deposited in the second modified first opening 516 of FIG. 5 may be transformed into portions of the self-forming barrier layer 214 of the interconnect 213 of FIG. 2 via chemical reaction between the portions of the layer 233 of FIG. 17 deposited in the second modified first opening 516 of FIG. 5 and portions of the dielectric layer 105 defining portions of the second modified first opening 516. Forming the layer 233 of FIG. 17 or the layer 233' of FIG. 18 in the second modified first opening 516 of FIG. 5 may result in a third modified first opening 1716 of FIGS. 17 and 18.

The material of layer 233 of FIG. 17 may be selectively deposited at a temperature of about 250° Celsius (C). Deposition of the material of the layer 233 at about 250° C. may cause aluminum to interact with the conductive material (e.g., Co or Ti) of the conductive layer 122 to form the inter-diffusion layer 103 of FIG. 18. For example, aluminum of the layer 233 of FIG. 17 or the layer 233' of FIG. 18 and aluminum of the first metal layer 102 may interact with the conductive material (e.g., Co or Ti) of the conductive layer 122 of FIG. 17 to form the inter-diffusion layer 103 of FIG. 18. As an example, when the conductive layer 122 of FIG. 17 is formed of or includes Co, aluminum of the layer 233 may interact with the Co to form the inter-diffusion layer 103 of FIG. 18 that includes Al and Co. In this example, the inter-diffusion layer 103 may be formed of or may include $Al_9Co_2$. The inter-diffusion layer 103 may serve as an EM cap.

Figure 19:
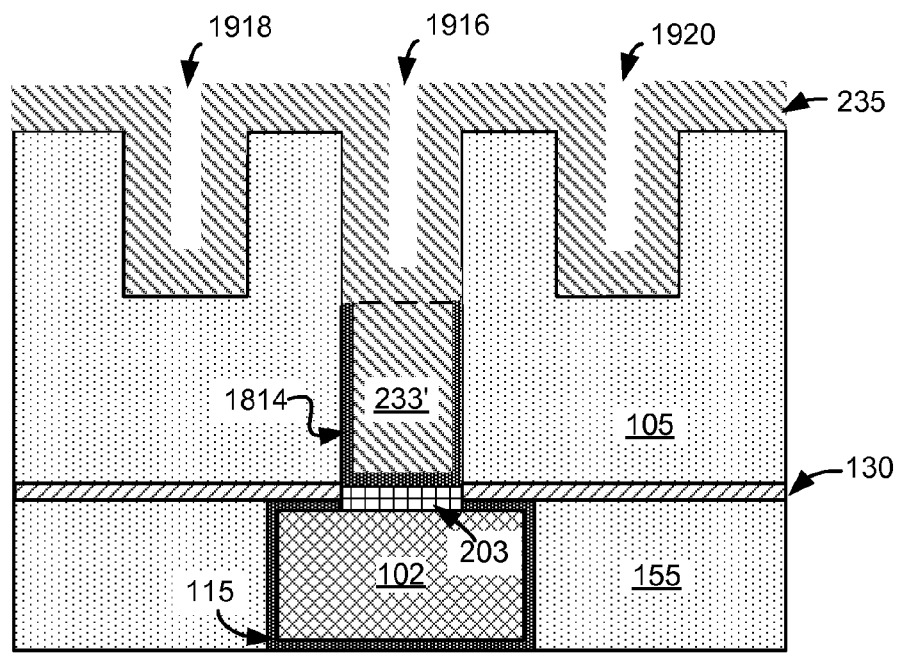
FIGS. 19 and 20 illustrate a fifth stage of a process of fabricating the device of FIG. 2.
Figure 20:
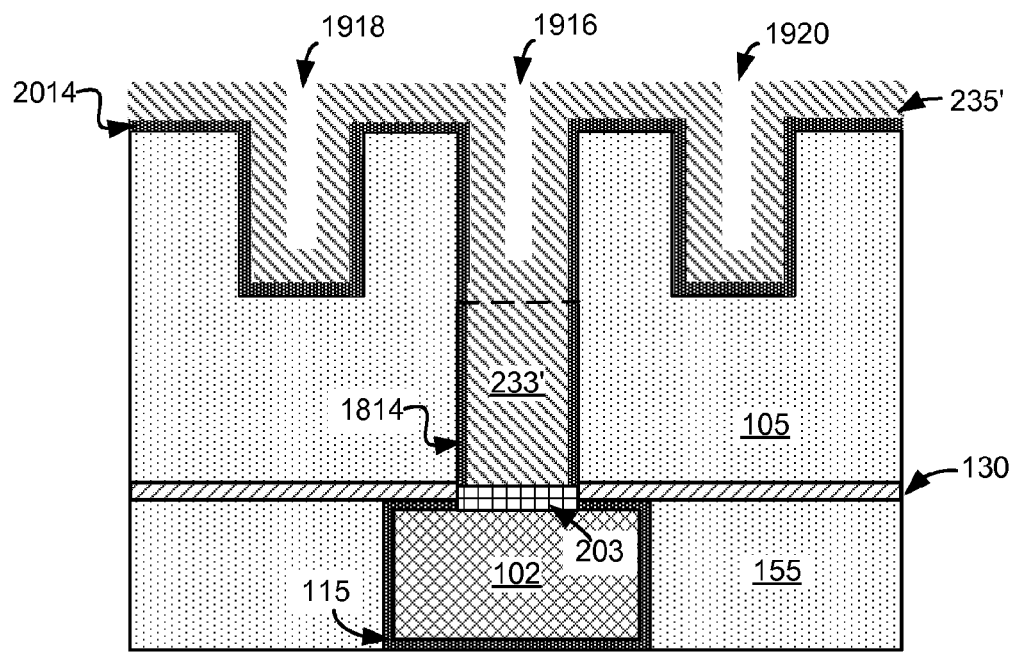

FIGS. 19 and 20 illustrate a fifth stage during fabrication of the integrated circuit device 200 of FIG. 2. The fifth stage may be performed after the fourth stage. The fifth stage of FIGS. 19 and 20 includes forming the layer 235 of FIG. 19. For example, the layer 235 may be formed by non-selectively depositing material of the layer 235 in the third modified first opening 1716 of FIG. 18, in the second opening 318 of FIG. 3, and in the third opening 320 of FIG. 3. The material of the layer 235 of FIG. 19 may include aluminum. In some examples, the material of the layer 235 may be non-selectively deposited using a non-selective conformal CVD technique to deposit the material of the layer 235 proximate to exposed portions of the dielectric layer 105 and proximate to exposed portions of the layer 233' and the self-forming barrier 1814. Forming the layer 235 of FIG. 19 may result in a fourth modified first opening 1916, a first modified second opening 1918, and a first modified third opening 1920.

A self-forming barrier 2014 of FIG. 20 may form in response to a chemical reaction between dielectric material of the dielectric layer 105 and aluminum of the layer 235 of FIG. 19. The self-forming barrier 2014 may correspond to portions of the self-forming barrier layer 214 of FIG. 2 of the interconnect 213, portions of the self-forming barrier layer 214 of the second metal line 208, and portions of the self-forming barrier layer 214 of the third metal line 212. The chemical reaction may transform portions of the layer 235 of FIG. 19 into the self-forming barrier 2014 of FIG. 20 while leaving other portions of the layer 235 of FIG. 19 unchanged. The layer 235' of FIG. 20 may correspond to portions of the layer 235 of FIG. 19 that remain substantially (or completely) unchanged (e.g., that do not undergo a chemical reaction with dielectric material of the dielectric layer 105).

For example, portions of the layer 235 of FIG. 19 deposited in the third modified first opening 1716 of FIG. 18 may be transformed into portions of the self-forming barrier layer 214 of the interconnect 213 of FIG. 2 via chemical reaction between the portions of the layer 235 of FIG. 19 deposited in the third modified first opening 1716 of FIG. 18 and portions of the dielectric layer 105 defining portions of the third modified first opening 1716. As another example, portions of the layer 235 of FIG. 19 deposited in the second opening 318 of FIG. 18 may be transformed into portions of the self-forming barrier layer 214 of the second metal line 208 of FIG. 2 via chemical reaction between the portions of the layer 235 of FIG. 19 deposited in the second opening 318 of FIG. 18 and portions of the dielectric layer 105 defining portions of the second opening 318. As another example, portions of the layer 235 of FIG. 19 deposited in the third opening 320 of FIG. 18 may be transformed into portions of the self-forming barrier layer 214 of the third metal line 212 of FIG. 2 via chemical reaction between the portions of the layer 235 of FIG. 19 deposited in the third opening 320 of FIG. 18 and portions of the dielectric layer 105 defining portions of the third opening 320.

In some examples, portions of the first opening 316 of FIG. 3, the second opening 318, and the third opening 320 may remain unfilled upon formation of the layer 235 of FIG. 19. In these examples, the layer 235 may serve as a seed layer to promote subsequent deposition of a dual damascene fill using physical vapor deposition (PVD). Thus, the first, second and third openings 316, 318, and 320 of FIG. 3 may be partially filled during the sixth stage of FIG. 19.

Alternatively, as described above, two primary fill stages may be used to form the primary fill of the first, second, and/or third metal lines 210, 208, and 212 of FIG. 2 and deposition of a third primary fill material as described below with reference to FIG. 21 may be omitted. When two primary fill stages are used to form the primary fill of the second metal layer 204 of FIG. 2, the layer 235 of FIG. 19 may include copper-doped aluminum (e.g., about 4% copper), and the second stage of forming the primary fill may include completely filling portions of the first, second, and third openings 316, 318, and 320 of FIG. 3 that remain to be filled after performance of the fifth state of FIGS. 17 and 18. In this example, the layer 235 of FIG. 19 may be deposited using a CVD technique. Thus, the first, second, and third openings 316, 318, and 320 of FIG. 3 may be completely filled during the sixth stage of FIGS. 19 and 20.

Figure 21:
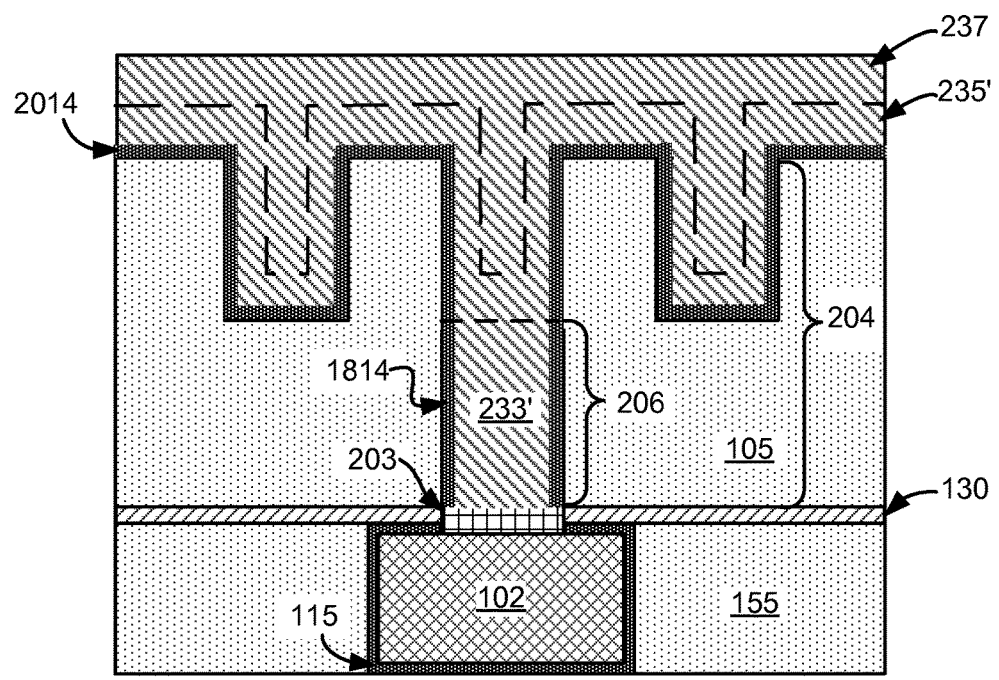
FIG. 21 illustrates a sixth stage of a process of fabricating the device of FIG. 2.

FIG. 21 illustrates a sixth stage during fabrication of the integrated circuit device 200 of FIG. 2. The sixth stage may be performed after the fifth stage. When three primary fill stages are used to form the primary fill of the second metal layer 204 as described above, the sixth stage of FIG. 21 includes forming the layer 237 and performing a reflow process on material of the second metal layer 204. For example, the material of the layer 237 may be deposited in the fourth modified first opening 1916 of FIG. 20, in the first modified second opening 1918, and in the first modified third opening 1920 proximate to exposed portions of the layer 235'. In some examples, the layer 237 of FIG. 21 may be formed using an in-situ PVD technique. The material of the layer 237 may include copper-doped aluminum.

Alternatively, when only two primary fill stages are used to form the primary fill of the second metal layer 204 of FIG. 2 as described above, the sixth stage includes performing the reflow process on the second metal layer 204 and may not include forming the layer 237 of FIG. 21.

The reflow process may include performing a reflow technique on material of the second metal layer 204 that includes aluminum (e.g., the layer 233', the layer 235', and/or the layer 237). The reflow process may be performed at about 400° C. The reflow process may remove point intersections of grain boundaries (e.g., triple points) in material of the second metal layer 204 that includes aluminum (e.g., the layer 233, the layer 235, and/or the layer 237), thereby improving EM behavior of the second metal layer 204.

Figure 22:
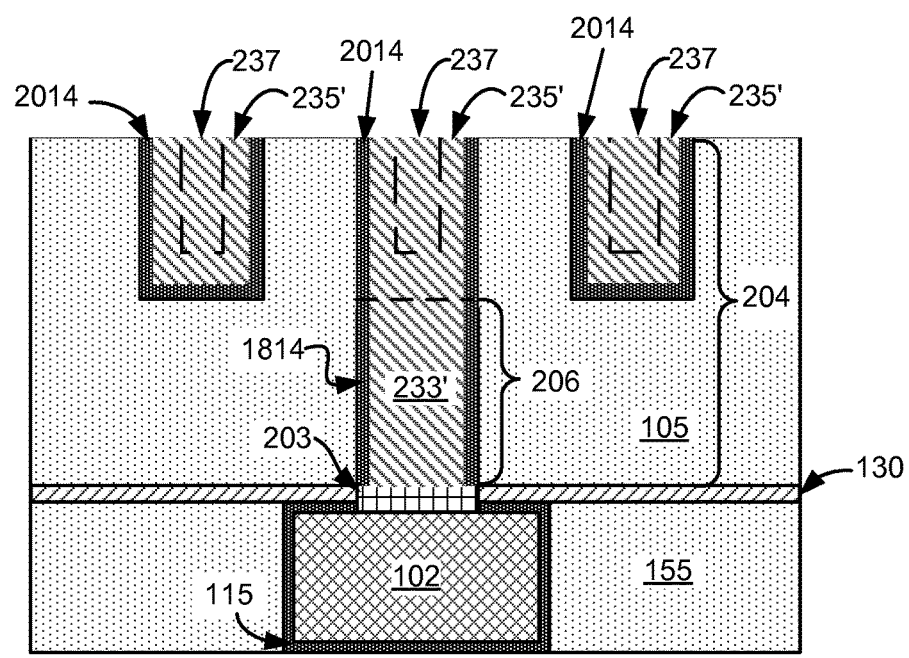
FIG. 22 illustrates a seventh stage of a process of fabricating the device of FIG. 2.

FIG. 22 illustrates a seventh stage during fabrication of the integrated circuit device 200 of FIG. 2. The seventh stage may be performed after the sixth stage. The seventh stage may include planarizing (e.g., by chemical mechanical planarization (CMP)) on portions of the self-forming barrier 2014 of FIG. 21, portions of the layer 235' of FIG. 21, and/or portions of layer 237 of FIG. 21 stopping on the dielectric layer 105.

Figure 23:
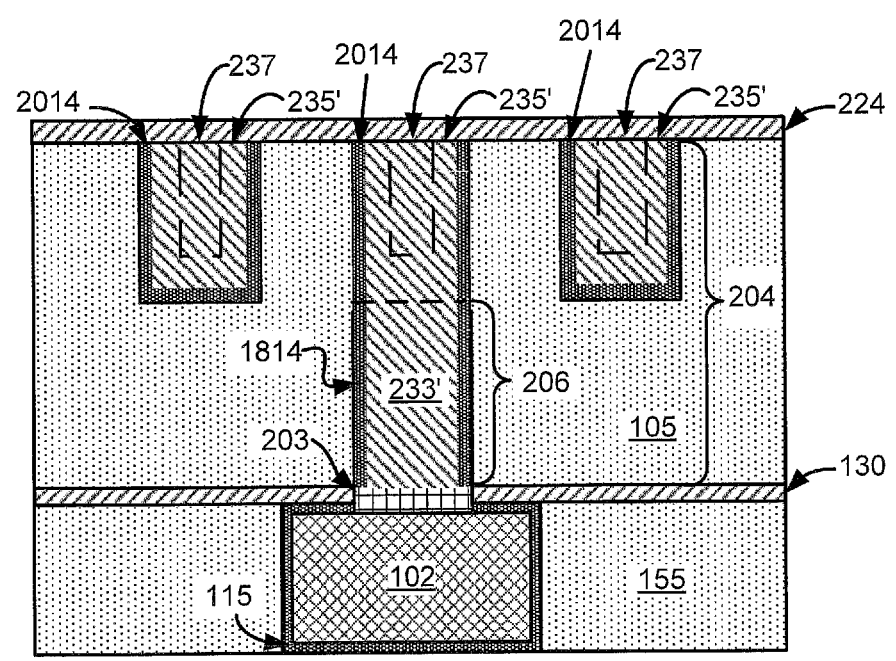
FIG. 23 illustrates an eighth stage of a process of fabricating the device of FIG. 2.

FIG. 23 illustrates an eighth stage during fabrication of the integrated circuit device 200 of FIG. 2. The eighth stage may be performed after the seventh stage. The eighth stage may include depositing an etch stop layer 224 proximate to the dielectric layer 105. The etch stop layer 224 may be formed of or include AlN.

Figure 24:
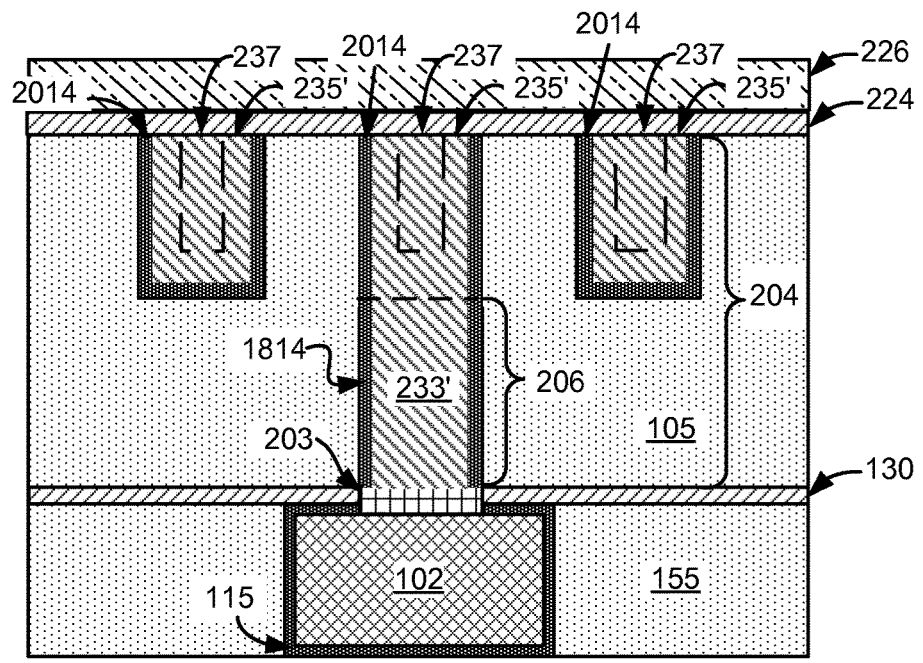
FIG. 24 illustrates a ninth stage of a process of fabricating the device of FIG. 2.

FIG. 24 illustrates a ninth stage during fabrication of the integrated circuit device 200 of FIG. 2. The ninth stage may be performed after the eighth stage. The ninth stage may include forming a photoresist layer 226 proximate to the etch stop layer 224.

Figure 25:
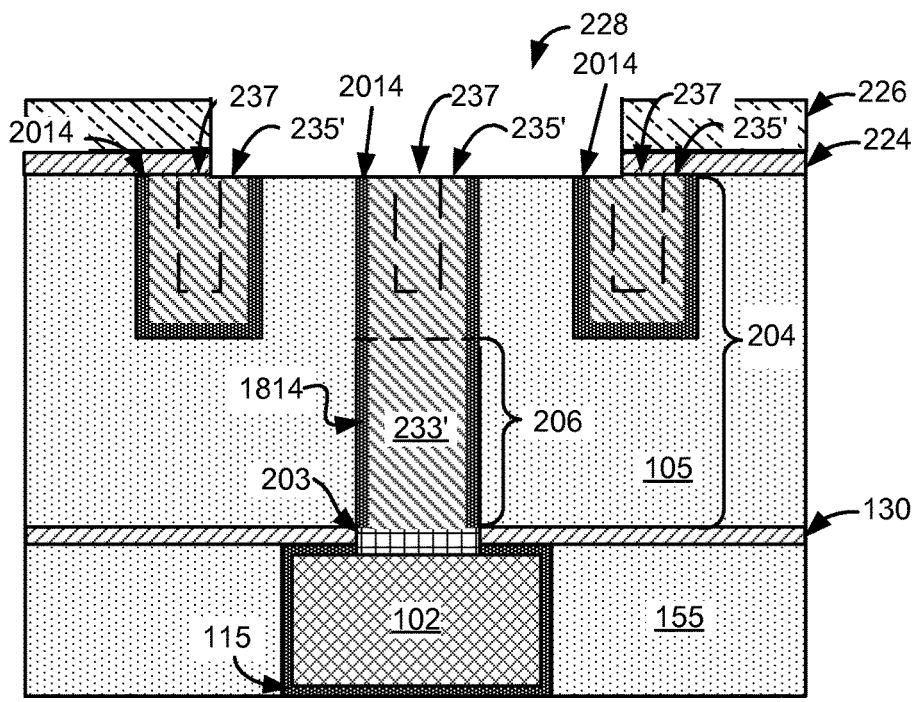
FIG. 25 illustrates a tenth stage of a process of fabricating the device of FIG. 2.

FIG. 25 illustrates a tenth stage during fabrication of the integrated circuit device 200 of FIG. 2. The tenth stage may be performed after the ninth stage. The tenth stage may include patterning the photoresist layer 226 and transferring the pattern to the etch stop layer 224 to form the opening 228. The pattern of the photoresist layer 226 may be transferred to the etch stop layer 224 by etching the etch stop layer 224 isotropically (e.g., using wet chemical etching) or anisotropically.

Figure 26:
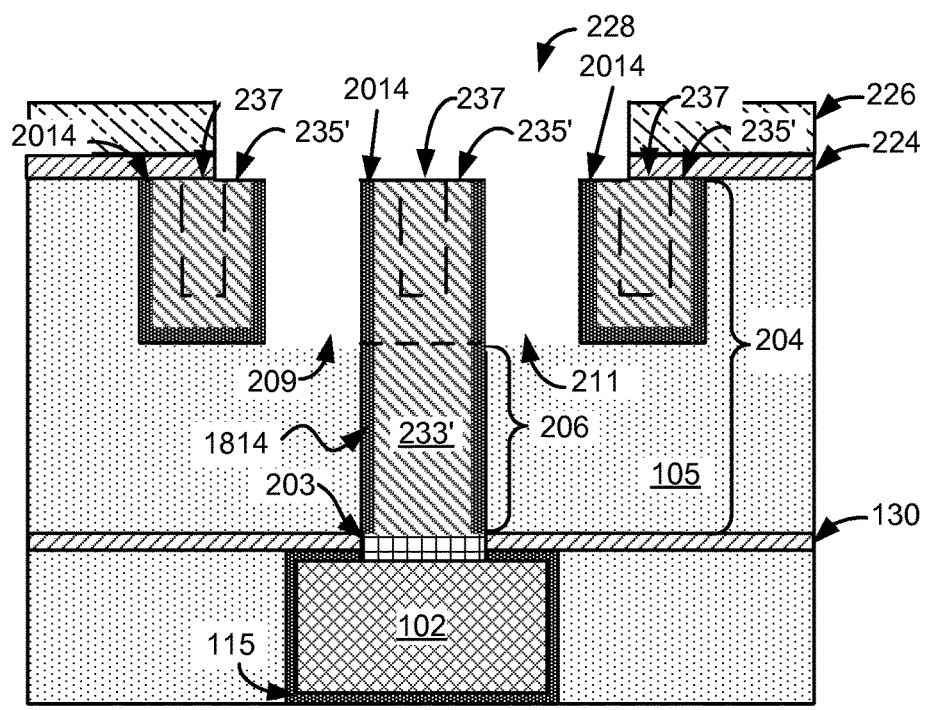
FIG. 26 illustrates an eleventh stage of a process of fabricating the device of FIG. 2.

FIG. 26 illustrates an eleventh stage during fabrication of the integrated circuit device 200 of FIG. 2. The eleventh stage may be performed after the tenth stage. The eleventh stage may include etching the dielectric layer 105 through the opening 228 to form the first airgap 209 and the second airgap 211. The dielectric layer 105 may be etched through the opening 228 isotropically (e.g., using wet chemical etching) or anisotropically.

Figure 27:
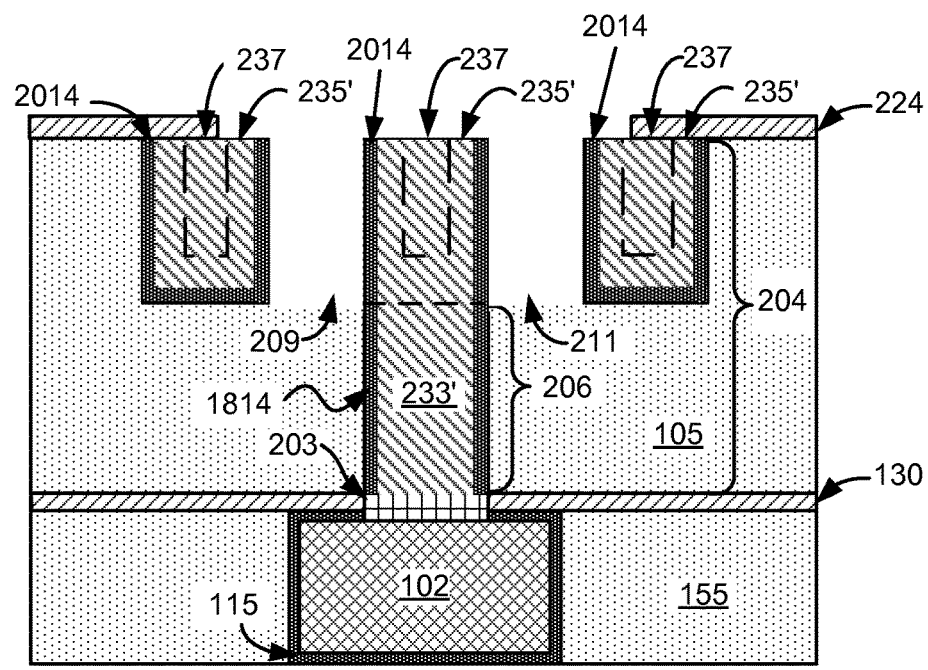
FIG. 27 illustrates a twelfth stage of a process of fabricating the device of FIG. 2.

FIG. 27 illustrates a twelfth stage during fabrication of the integrated circuit device 200 of FIG. 2. The twelfth stage may be performed after the eleventh stage. The twelfth stage may include removing remaining portions of the photoresist layer 226 of FIG. 26 and performing a post-etch clean (e.g., a wet clean or a dry clean) to remove etch polymer.

Turning back to FIG. 2, a thirteenth stage during fabrication of the integrated circuit device 200 is illustrated. The thirteenth stage may be performed after the twelfth stage. The thirteenth stage may include sealing the first and second airgaps 209 and 211 by depositing (e.g., using a non-conformal deposition technique) a dielectric material 232 (e.g., a low-K dielectric material) proximate to (e.g., on, above, or over) the etch stop layer 224.

Figure 28:
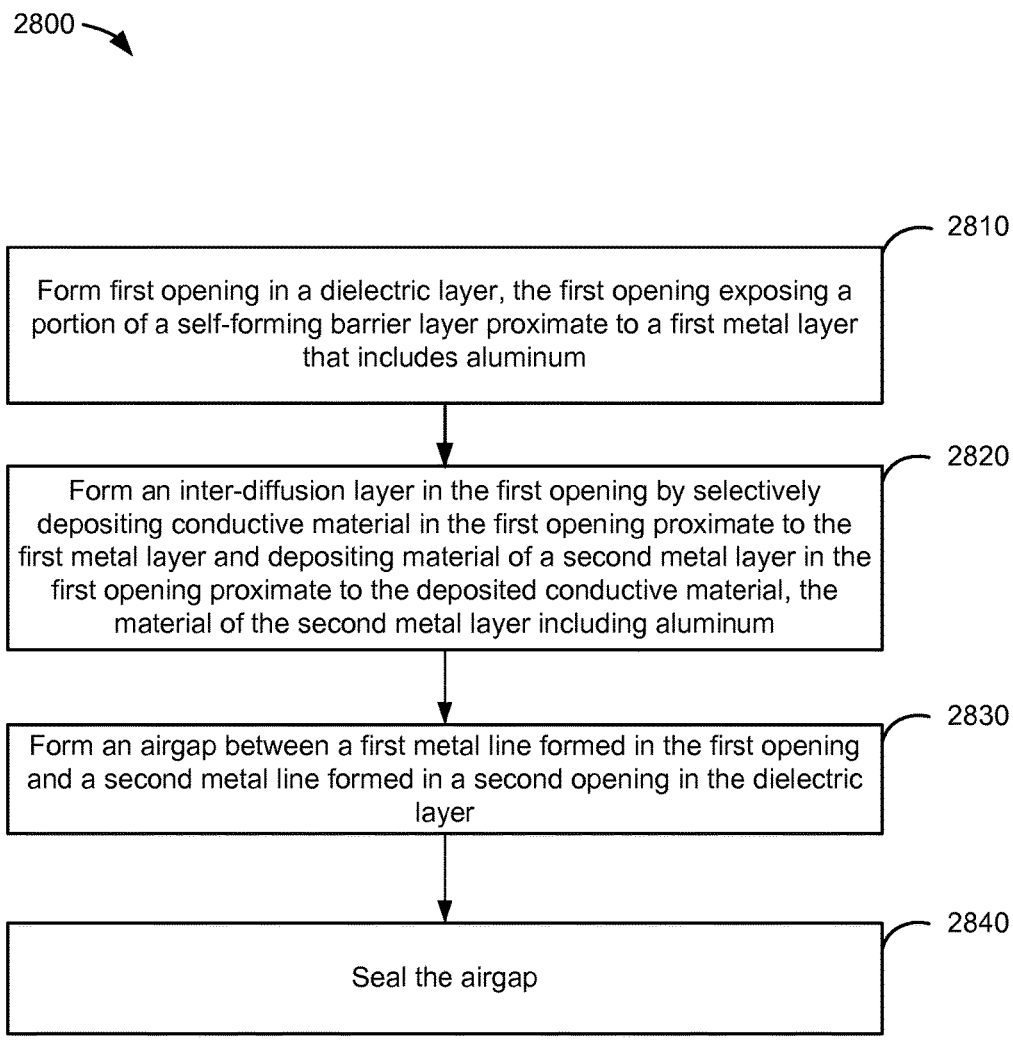
FIG. 28 illustrates a method of fabricating the device of FIG. 1 or the device of FIG. 2.

Referring to FIG. 28, a flow chart of an illustrative example of a method of fabricating an integrated circuit device is depicted. The integrated circuit device may correspond to the integrated circuit device 100 of FIG. 1 or the integrated circuit device 200 of FIG. 2.

The method of FIG. 28 includes forming, at 2810, a first opening in a dielectric layer. The first opening may correspond to the first modified first opening 416 of FIG. 4. Forming the first modified first opening 416 may include forming the first opening 316 of FIG. 3 as described above with reference to the first stage of FIG. 3 and may further include performing an in-situ H Radical treatment on the portion 340 of the self-forming barrier layer 115 as described above with reference to the second stage of FIG. 4. The first modified first opening 416 of FIG. 4 may expose the portion 440 of the first metal layer 102.

The method of FIG. 28 further includes forming, at 2820, an inter-diffusion layer. The inter-diffusion layer may correspond to the inter-diffusion layer 103 of FIGS. 1 and 8-16 or the inter-diffusion layer 203 of FIGS. 2 and 18-27. The inter-diffusion layer 103 of FIGS. 1 and 8-16 or the inter-diffusion layer 203 of FIGS. 2 and 18-27 may be formed as described above with reference to the third through fifth stages of FIGS. 5-8 during fabrication of the integrated circuit device 100 of FIG. 1 or may be formed as described above with reference to the third and fourth stages of FIGS. 5, 17, and 18 during fabrication of the integrated circuit device 200 of FIG. 2.

For example, the inter-diffusion layer 103 of FIGS. 1 and 8-16 or the inter-diffusion layer 203 of FIGS. 2 and 18-27 may be formed at least in part by selectively forming a conductive layer in the first opening (e.g., the first modified first opening 416 of FIG. 4) proximate to a first metal layer 102 (e.g., proximate to the exposed portion 440) as described above with reference to FIG. 5.

The inter-diffusion layer 103 of FIGS. 1 and 8-16 or the inter-diffusion layer 203 of FIGS. 2 and 18-27 may further be formed at least in part by depositing material of a second metal layer proximate to the conductive layer 122. For example, the layer 119 of FIG. 6 may be deposited as described above with reference to the fifth stage of FIGS. 6 and 7. As another example, the layer 233 of FIG. 17 may be deposited as described above with reference to the fourth stage of FIGS. 17 and 18. Forming the inter-diffusion layer 103 of FIGS. 1 and 8-16 may further include selectively depositing the layer 133 of FIG. 8 within the first opening (e.g., in the second modified first opening of FIG. 7).

As described above, the layer 133 of FIG. 8 or the layer 233 of FIG. 17 may be selectively deposited using a CVD process at about 250° Celsius (C). Deposition of the layer 133 of FIG. 8 or the layer 233 of FIG. 17 at about 250° C. may cause aluminum to interact with the conductive layer 122 of FIG. 7 or FIG. 17 to form the inter-diffusion layer 103 of FIGS. 1 and 8-16 or the inter-diffusion layer 203 of FIGS. 2 and 18-27. For example, when the layer 119 of FIG. 6 is used, aluminum of the layer 119 and aluminum of the first metal layer 102 may interact with conductive material (e.g., Co or Ti) of the conductive layer 122 to form the inter-diffusion layer 103 of the integrated circuit device 100 of FIG. 1. Alternatively, the layer 119 of FIG. 6 may not be formed and the aluminum of the first metal layer 102 of FIG. 17 and the aluminum of the layer 233 may interact with the conductive material (e.g., Co or Ti) of the conductive layer 122 to form the inter-diffusion layer 203 of the integrated circuit device 200 of FIG. 2.

The method of FIG. 28 may further include performing a reflow process on material of the second metal layer that includes aluminum. The reflow process may be performed on material of the second metal layer as described above with reference to the seventh stage of FIG. 10 or the sixth stage of FIG. 21.

The method of FIG. 28 may further include forming, at 2830, an airgap between a first metal line and a second metal line. The airgap may correspond to the first airgap 109 or the second airgap 111 of the integrated circuit device 100 of FIG. 1 and may be formed as described above with reference to the ninth through twelfth stages of FIGS. 12-15. Alternatively, the airgap may correspond to the first airgap 209 or the second airgap 211 of the integrated circuit device 200 of FIG. 2 and may be formed as described above with reference to the eighth through eleventh stages of FIGS. 23-26.

The method of FIG. 28 may further include sealing, at 2840, the airgap. For example, the first and/or second airgaps 109 and/or 111 of the integrated circuit device 100 of FIG. 1 may be sealed by depositing a dielectric material proximate (e.g., on, over, or above) to the etch stop layer 124 of FIG. 1 as described above with reference to the fourteenth stage of FIG. 1. For example, the first airgap 109 and the second airgap 111 may be sealed by depositing the dielectric material 132 proximate to the etch stop layer 124.

As another example, the first and/or second airgaps 209 and/or 211 of the integrated circuit device 200 of FIG. 2 may be sealed by depositing a dielectric material proximate (e.g., on, over, or above) to the etch stop layer 224 of FIG. 2 as described above with reference to the thirteenth stage of FIG. 2. For example, the first airgap 209 and the second airgap 211 may be sealed by depositing the dielectric material 232 proximate to the etch stop layer 224.

Figure 29:
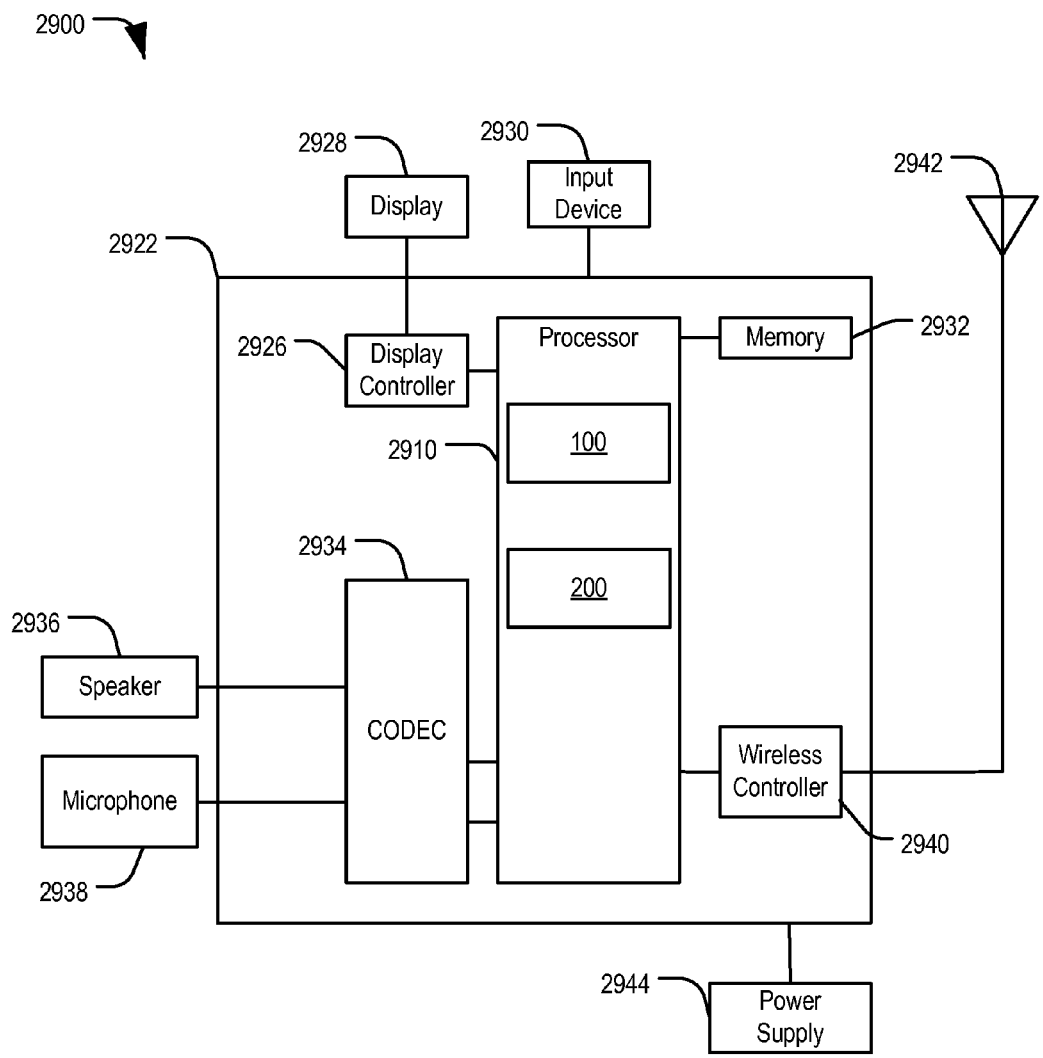
FIG. 29 is a block diagram of a wireless device including the device of FIG. 1 or the device of FIG. 2.

Referring to FIG. 29, a block diagram of a particular illustrative example of an electronic device is depicted and generally designated 2900. The electronic device 2900 includes a processor 2910, such as a digital signal processor (DSP), coupled to a memory 2932 (e.g., a random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art). The processor 2910 may include one or more integrated circuit devices that include an inter-diffusion layer. For example, the processor 2910 may include the integrated circuit device 100 of FIG. 1, the integrated circuit device 200 of FIG. 2, or both.

FIG. 29 also shows a display controller 2926 that is coupled to the processor 2910 and to a display 2928. A coder/decoder (CODEC) 2934 may also be coupled to the processor 2910. A speaker 2936 and a microphone 2938 may be coupled to the CODEC 2934.

FIG. 29 also indicates that a wireless controller 2940 may be coupled to the processor 2910 and may be further coupled to an antenna 2942. In a particular implementation, the processor 2910, the display controller 2926, the memory 2932, the CODEC 2934, and the wireless controller 2940 are included in a system-in-package or system-on-chip device 2922. In a particular implementation, an input device 2930 and a power supply 2944 are coupled to the system-on-chip device 2922. Moreover, in a particular implementation, as illustrated in FIG. 29, the display 2928, the input device 2930, the speaker 2936, the microphone 2938, the antenna 2942, and the power supply 2944 are external to the system-on-chip device 2922. However, each of the display 2928, the input device 2930, the speaker 2936, the microphone 2938, the antenna 2942, and the power supply 2944 may be coupled to a component of the system-on-chip device 2922, such as an interface or a controller.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then integrated into electronic devices, as described further with reference to FIG. 30.

Figure 30:
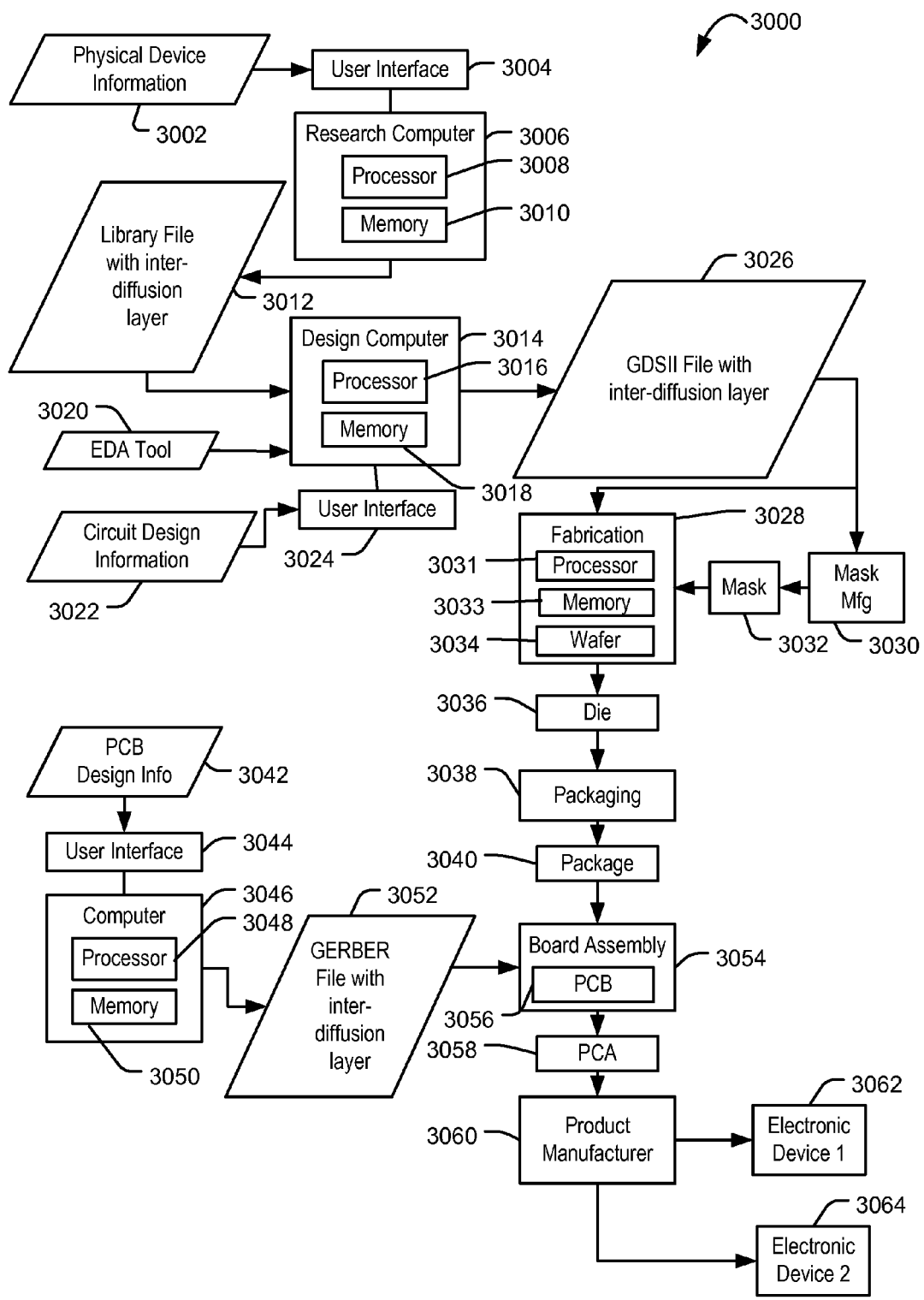
FIG. 30 is a data flow diagram of a particular illustrative implementation of a manufacturing process to manufacture electronic devices that include an inter-diffusion layer between a first metal line and a lower layer metal layer.

Referring to FIG. 30, a particular illustrative example of an integrated circuit device manufacturing (e.g., fabricating) process is depicted and generally designated 3000. Physical device information 3002 is received at the manufacturing process 3000, such as at a research computer 3006. The physical device information 3002 may include design information representing at least one physical property of a semiconductor device, such as the integrated circuit device 100 of FIG. 1 or the integrated circuit device 200 of FIG. 2. For example, the physical device information 3002 may include design information representing physical parameters, material characteristics, and/or structure information regarding the inter-diffusion layer 103 of FIG. 1, the first airgap 109, the second airgap 111, the interconnect 113, the second metal line 108, the third metal line 112, the inter-diffusion layer 203 of FIG. 2, the first airgap 209, the second airgap 211, the interconnect 213, the second metal line 208, the third metal line 212, or any combination thereof. For example, the physical device information 3002 may include physical parameters, material characteristics, and structure information that is entered via a user interface 3004 coupled to the research computer 3006. The research computer 3006 includes a processor 3008, such as one or more processing cores, coupled to a computer readable medium (e.g., a non-transitory computer-readable storage medium), such as a memory 3010. The memory 3010 may store computer readable instructions that are executable to cause the processor 3008 to transform the physical device information 3002 to comply with a file format and to generate a library file 3012.

In a particular implementation, the library file 3012 includes at least one data file including the transformed design information. For example, the library file 3012 may include a library of semiconductor devices including a device that includes the integrated circuit device 100 of FIG. 1 and/or that includes the integrated circuit device 200 of FIG. 2 that is provided for use with an electronic design automation (EDA) tool 3020.

The library file 3012 may be used in conjunction with the EDA tool 3020 at a design computer 3014 including a processor 3016, such as one or more processing cores, coupled to a memory 3018. The EDA tool 3020 may be stored as processor executable instructions at the memory 3018 to enable a user of the design computer 3014 to design a circuit including the inter-diffusion layer 103 of FIG. 1, the first airgap 109, the second airgap 111, the interconnect 113, the second metal line 108, the third metal line 112, the inter-diffusion layer 203 of FIG. 2, the first airgap 209, the second airgap 211, the interconnect 213, the second metal line 208, the third metal line 212, or any combination thereof, of the library file 3012. For example, a user of the design computer 3014 may enter circuit design information 3022 via a user interface 3024 coupled to the design computer 3014. The circuit design information 3022 may include design information representing at least one physical property of at least a portion of a semiconductor device, such as the inter-diffusion layer 103 of FIG. 1, the first airgap 109, the second airgap 111, the interconnect 113, the second metal line 108, the third metal line 112, the inter-diffusion layer 203 of FIG. 2, the first airgap 209, the second airgap 211, the interconnect 213, the second metal line 208, the third metal line 212, or any combination thereof. To illustrate, the circuit design property may include identification of particular circuits and relationships to other elements in a circuit design, positioning information, feature size information, interconnection information, or other information representing a physical property of a semiconductor device.

The design computer 3014 may be configured to transform the design information, including the circuit design information 3022, to comply with a file format. To illustrate, the file format may include a database binary file format representing planar geometric shapes, text labels, and other information about a circuit layout in a hierarchical format, such as a Graphic Data System (GDSII) file format. The design computer 3014 may be configured to generate a data file including the transformed design information, such as a GDSII file 3026 that includes information describing the integrated circuit device 100 of FIG. 1 and/or the integrated circuit device 200 of FIG. 2 in addition to other circuits or information. To illustrate, the data file may include information corresponding to a system-on-chip (SOC) that includes the inter-diffusion layer 103 of FIG. 1, the first airgap 109, the second airgap 111, the interconnect 113, the second metal line 108, the third metal line 112, the inter-diffusion layer 203 of FIG. 2, the first airgap 209, the second airgap 211, the interconnect 213, the second metal line 208, the third metal line 212, or any combination thereof, and that also includes additional electronic circuits and components within the SOC.

The GDSII file 3026 may be received at a fabrication process 3028 to fabricate the integrated circuit device 100 of FIG. 1 and/or the integrated circuit device 200 of FIG. 2 according to transformed information in the GDSII file 3026. For example, a device manufacturing process may include providing the GDSII file 3026 to a mask manufacturer 3030 to create one or more masks, such as masks to be used with photolithography processing, illustrated as a representative mask 3032. The mask 3032 may be used during the fabrication process to generate one or more wafers 3034, which may be tested and separated into dies, such as a representative die 3036. The die 3036 includes a circuit including a device that includes the integrated circuit device 100 of FIG. 1 and/or the integrated circuit device 200 of FIG. 2.

For example, the fabrication process 3028 may include a processor 3031 and a memory 3033 to initiate and/or control the fabrication process 3028. The memory 3033 may include executable instructions such as computer-readable instructions or processor-readable instructions. The executable instructions may include one or more instructions that are executable by a computer such as the processor 3031. In a particular implementation, the executable instructions may cause a computer to perform the method 2800 of FIG. 28 or at least a portion thereof.

The fabrication process 3028 may be implemented by a fabrication system that is fully automated or partially automated. For example, the fabrication process 3028 may be automated according to a schedule. The fabrication system may include fabrication equipment (e.g., processing tools) to perform one or more operations to form a semiconductor device. For example, the fabrication equipment may be configured to deposit one or more materials using chemical vapor deposition (CVD) and/or physical vapor deposition (PVD), pattern materials using a single-mask or multi-mask litho-etch process (e.g., two-mask LELE), pattern materials using a litho-freeze-litho-etch (LFLE) process, pattern materials using a self-aligned double patterning (SADP) process, epitaxially grow one or more materials, conformally deposit one or more materials, apply a hardmask, apply an etching mask, perform etching, perform planarization, form a dummy gate stack, form a gate stack, perform a standard clean 1 type, etc. In a particular implementation, the fabrication process 3028 corresponds to a semiconductor manufacturing process associated with a technology node smaller than 14 nm (e.g., 10 nm, 7 nm, etc.). The specific process or combination of processes used to manufacture a device (e.g., including the inter-diffusion layer 103 of FIG. 1, the first airgap 109, the second airgap 111, the interconnect 113, the second metal line 108, the third metal line 112, the inter-diffusion layer 203 of FIG. 2, the first airgap 209, the second airgap 211, the interconnect 213, the second metal line 208, the third metal line 212, or any combination thereof) may be based on design constraints and available materials/equipment. Thus, different processes may be used than described with reference to FIGS. 1-30 during manufacture of the device.

The fabrication system (e.g., an automated system that performs the fabrication process 3028) may have a distributed architecture (e.g., a hierarchy). For example, the fabrication system may include one or more processors, such as the processor 3031, one or more memories, such as the memory 3033, and/or controllers that are distributed according to the distributed architecture. The distributed architecture may include a high-level processor that controls or initiates operations of one or more low-level systems. For example, a high-level portion of the fabrication process 3028 may include one or more processors, such as the processor 3031, and the low-level systems may each include or may be controlled by one or more corresponding controllers. A particular controller of a particular low-level system may receive one or more instructions (e.g., commands) from a particular high-level system, may issue sub-commands to subordinate modules or process tools, and may communicate status data back to the particular high-level. Each of the one or more low-level systems may be associated with one or more corresponding pieces of fabrication equipment (e.g., processing tools). In a particular implementation, the fabrication system may include multiple processors that are distributed in the fabrication system. For example, a controller of a low-level system component may include a processor, such as the processor 3031.

Alternatively, the processor 3031 may be a part of a high-level system, subsystem, or component of the fabrication system. In another implementation, the processor 3031 includes distributed processing at various levels and components of a fabrication system.

The executable instructions included in the memory 3033 may enable the processor 3031 to form (or initiate formation of) the inter-diffusion layer 103 of FIG. 1, the first airgap 109, the second airgap 111, the interconnect 113, the second metal line 108, the third metal line 112, the inter-diffusion layer 203 of FIG. 2, the first airgap 209, the second airgap 211, the interconnect 213, the second metal line 208, the third metal line 212, or any combination thereof. In a particular implementation, the memory 3033 is a non-transitory computer-readable medium storing computer-executable instructions that are executable by the processor 3031 to cause the processor 3031 to initiate formation of a device in accordance with at least a portion of the method 2800 of FIG. 28. For example, the computer executable instructions may be executable to cause the processor 3031 to initiate formation of the inter-diffusion layer 103 of FIG. 1, the first airgap 109, the second airgap 111, the interconnect 113, the second metal line 108, the third metal line 112, the inter-diffusion layer 203 of FIG. 2, the first airgap 209, the second airgap 211, the interconnect 213, the second metal line 208, the third metal line 212, or any combination thereof. As an illustrative example, the processor 3031 may initiate or control one or more steps of the method 2800 of FIG. 28.

The die 3036 may be provided to a packaging process 3038 where the die 3036 is incorporated into a representative package 3040. For example, the package 3040 may include the single die 3036 or multiple dies, such as a system-in-package (SiP) arrangement. The package 3040 may be configured to conform to one or more standards or specifications, such as Joint Electron Device Engineering Council (JEDEC) standards.

Information regarding the package 3040 may be distributed to various product designers, such as via a component library stored at a computer 3046. The computer 3046 may include a processor 3048, such as one or more processing cores, coupled to a memory 3050. A printed circuit board (PCB) tool may be stored as processor executable instructions at the memory 3050 to process PCB design information 3042 received from a user of the computer 3046 via a user interface 3044. The PCB design information 3042 may include physical positioning information of a packaged semiconductor device on a circuit board, the packaged semiconductor device corresponding to the package 3040 including the inter-diffusion layer 103 of FIG. 1, the first airgap 109, the second airgap 111, the interconnect 113, the second metal line 108, the third metal line 112, the inter-diffusion layer 203 of FIG. 2, the first airgap 209, the second airgap 211, the interconnect 213, the second metal line 208, the third metal line 212, or any combination thereof.

The computer 3046 may be configured to transform the PCB design information 3042 to generate a data file, such as a GERBER file 3052 with data that includes physical positioning information of a packaged semiconductor device on a circuit board, as well as layout of electrical connections such as traces and vias, where the packaged semiconductor device corresponds to the package 3040 including the inter-diffusion layer 103 of FIG. 1, the first airgap 109, the second airgap 111, the interconnect 113, the second metal line 108, the third metal line 112, the inter-diffusion layer 203 of FIG. 2, the first airgap 209, the second airgap 211, the interconnect 213, the second metal line 208, the third metal line 212, or any combination thereof. In other implementations, the data file generated by the transformed PCB design information may have a format other than a GERBER format.

The GERBER file 3052 may be received at a board assembly process 3054 and used to create PCBs, such as a representative PCB 3056, manufactured in accordance with the design information stored within the GERBER file 3052. For example, the GERBER file 3052 may be uploaded to one or more machines to perform various steps of a PCB production process. The PCB 3056 may be populated with electronic components including the package 3040 to form a representative printed circuit assembly (PCA) 3058.

The PCA 3058 may be received at a product manufacturing process 3060 and integrated into one or more electronic devices, such as a first representative electronic device 3062 and a second representative electronic device 3064. For example, the first representative electronic device 3062, the second representative electronic device 3064, or both, may include or correspond to the electronic device 2900 of FIG. 29. As an illustrative, non-limiting example, the first representative electronic device 3062, the second representative electronic device 3064, or both, may include a communications device, a fixed location data unit, a mobile location data unit, a mobile phone, a cellular phone, a satellite phone, a computer, a tablet, a portable computer, or a desktop computer. Alternatively or additionally, the first representative electronic device 3062, the second representative electronic device 3064, or both, may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, any other device that stores or retrieves data or computer instructions, or a combination thereof, into which the into which the integrated circuit device 100 of FIG. 1 and/or the integrated circuit device 200 of FIG. 2 is integrated.

As another illustrative, non-limiting example, one or more of the electronic devices 3062 and 3064 may include remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 30 illustrates remote units according to teachings of the disclosure, the disclosure is not limited to these illustrated units. Examples, implementations, and/or aspects of the disclosure may be suitably employed in any device which includes active integrated circuitry including memory and on-chip circuitry. For example, one or more of the electronic device 3062 and 3064 may include cars, trucks, airplanes, boats, other vehicles, or appliances, such as refrigerators, microwaves, washing machines, security systems, other appliances, or a combination thereof. In a particular implementation, one or more of the electronic device 3062 and 3064 may utilize memory and/or wireless communication.

A device that includes the integrated circuit device 100 of FIG. 1 and/or the integrated circuit device 200 of FIG. 2 may be fabricated, processed, and incorporated into an electronic device, as described in the illustrative process 3000. One or more aspects of the implementations disclosed with respect to FIGS. 1-29 may be included at various processing stages, such as within the library file 3012, the GDSII file 3026 (e.g., a file having a GDSII format), and the GERBER file 3052 (e.g., a file having a GERBER format), as well as stored at the memory 3010 of the research computer 3006, the memory 3018 of the design computer 3014, the memory 3050 of the computer 3046, the memory of one or more other computers or processors (not shown) used at the various stages, such as at the board assembly process 3054, and also incorporated into one or more other physical implementations such as the mask 3032, the die 3036, the package 3040, the PCA 3058, other products such as prototype circuits or devices (not shown), or any combination thereof. Although various representative stages of production from a physical device design to a final product are depicted, in other implementations fewer stages may be used or additional stages may be included. Similarly, the process 3000 may be performed by a single entity or by one or more entities performing various stages of the process 3000.

Although one or more of FIGS. 1-30 may illustrate systems, devices, and/or methods according to the teachings of the disclosure, the disclosure is not limited to these illustrated systems, devices, and/or methods. Examples, implementations, or aspects of the disclosure may be suitably employed in any device that includes integrated circuitry including memory, a processor, and on-chip circuitry.

One or more functions or components of any of FIGS. 1-30 as illustrated or described herein may be combined with one or more other portions of another of FIGS. 1-30. Accordingly, no single example, implementation, or aspect described herein should be construed as limiting and examples, implementations, or aspects of the disclosure may be suitably combined without departing form the teachings of the disclosure.

Those of skill would further appreciate that the various illustrative logical blocks, configurations, modules, circuits, and algorithm steps described in connection with the examples, implementations, or aspects disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the examples, implementations, or aspects disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal. A storage device is not a signal.

The previous description of the disclosed examples, implementations, or aspects is provided to enable a person skilled in the art to make or use the disclosed examples, implementations, or aspects. Various modifications to these examples, implementations, or aspects will be readily apparent to those skilled in the art, and the principles defined herein may be applied to other examples, implementations, or aspects without departing from the scope of the disclosure. Thus, the present disclosure is not intended to be limited to the examples, implementations, or aspects shown herein but is to be accorded the widest scope possible consistent with the principles and novel features as defined by the following claims.

What is claimed is:

1. An integrated circuit device, comprising:
   a first metal layer comprising aluminum;
   a second metal layer including an interconnect structure, wherein the interconnect structure includes a layer of first material including aluminum;
   an inter-diffusion layer including aluminum, the inter-diffusion layer proximate to the first metal layer and proximate to the layer of first material including aluminum; and
   a self-forming barrier layer including aluminum, the self-forming barrier layer proximate to a dielectric layer and the layer of first material including aluminum.

2. The integrated circuit device of claim 1, wherein the inter-diffusion layer is in direct contact with the first metal layer.

3. The integrated circuit device of claim 1, wherein the inter-diffusion layer includes $Al_9Co_2$.

4. The integrated circuit device of claim 1, wherein the second metal layer comprises a first metal line and a second metal line separated by an airgap.

5. The integrated circuit device of claim 4, wherein the second metal layer further includes a third metal line separated from the first metal line by a second airgap.

6. The integrated circuit device of claim 5, wherein the airgap has a width of about 12 nanometers (nm).

7. A method of forming an integrated circuit device, the method comprising:
   forming a first opening in a dielectric layer, the first opening exposing a portion of a first metal layer that includes aluminum; and forming an inter-diffusion layer at least in part by:
  selectively forming a conductive layer proximate to the portion of the first metal layer; and
  depositing material of a second metal layer proximate to the conductive layer, wherein the material of the second metal layer includes aluminum.

8. The method of claim 7, wherein depositing the material of the second metal layer includes depositing copper-doped aluminum.

9. The method of claim 7, wherein depositing the material of the second metal layer comprises depositing a seed layer.

10. The method of claim 7, further comprising performing an aluminum reflow process on the second metal layer.

11. The method of claim 7, wherein forming the first opening includes performing an in-situ H radical treatment on a portion of a self-forming barrier layer that is proximate to the first metal layer.

12. The method of claim 7, forming an airgap between a first metal line formed in the first opening and a second metal line formed in a second opening formed in the dielectric layer.

13. The method of claim 12, wherein forming the airgap comprises:
  depositing an etch stop layer proximate to the dielectric layer;
  forming first and second openings in the etch stop layer, the first and second openings in the etch stop layer exposing first and second portions of the dielectric layer located between the first and second metal lines; and
  etching the first and second portions of the dielectric layer through the first and second openings in the etch stop layer.

14. The method of claim 13, further comprising sealing the airgap by depositing a dielectric material proximate to the etch stop layer.

15. A non-transitory computer-readable medium comprising processor-executable instructions that, when executed by a processor, cause the processor to:
  initiate fabrication of an electronic device, the electronic device fabricated by:
    forming a first opening in a dielectric layer, the first opening exposing a portion of a first metal layer that includes aluminum; and
    forming an inter-diffusion layer at least in part by:
      selectively forming a conductive layer proximate to the portion of the first metal layer; and
      depositing material of a second metal layer proximate to the conductive layer, wherein the material of the second metal layer includes aluminum.

16. The non-transitory computer-readable medium of claim 15, wherein depositing the material of the second metal layer includes depositing copper-doped aluminum.

17. The non-transitory computer-readable medium of claim 15, wherein depositing the material of the second metal layer comprises depositing a seed layer.

18. The non-transitory computer-readable medium of claim 15, wherein the electronic device is further fabricated by performing an aluminum reflow process on the second metal layer.

19. The non-transitory computer-readable medium of claim 15, wherein forming the first opening includes performing an in-situ H radical treatment on a portion of a self-fainting barrier layer that is proximate to the first metal layer.

20. The non-transitory computer-readable medium of claim 15, wherein the electronic device is further fabricated by forming an airgap between a first metal line formed in the first opening and a second metal line formed in a second opening formed in the dielectric layer.

* * * * *